(12) United States Patent
Hung

(10) Patent No.: US 11,262,262 B2
(45) Date of Patent: Mar. 1, 2022

(54) PRESSURE SENSOR AND MANUFACTURING METHOD THEREOF

(71) Applicant: TAIWAN SEMICONDUCTOR MANUFACTURING COMPANY LTD., Hsinchu (TW)

(72) Inventor: Chi-Chao Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 364 days.

(21) Appl. No.: 16/258,791

(22) Filed: Jan. 28, 2019

(65) Prior Publication Data

US 2020/0240866 A1 Jul. 30, 2020

(51) Int. Cl.
*G01L 9/00* (2006.01)
*G01L 13/06* (2006.01)

(52) U.S. Cl.
CPC ............ *G01L 9/0072* (2013.01); *G01L 13/06* (2013.01)

(58) Field of Classification Search
None
See application file for complete search history.

(56) References Cited

U.S. PATENT DOCUMENTS

| | | | | |
|---|---|---|---|---|
| 5,929,497 | A | * | 7/1999 | Chavan ................... B81B 7/007 257/417 |
| 8,368,152 | B2 | * | 2/2013 | Chu ........................ H01L 29/84 257/415 |
| 8,952,467 | B2 | * | 2/2015 | Yoshizawa ................ B81C 1/00 257/415 |
| 2003/0019299 | A1 | * | 1/2003 | Horie ..................... G01L 9/0073 73/718 |
| 2017/0210614 | A1 | * | 7/2017 | Cheng ................. B81C 1/00825 |
| 2017/0210618 | A1 | * | 7/2017 | Chang ................... B81B 3/0021 |
| 2017/0313574 | A1 | * | 11/2017 | Hsieh .................... B81B 3/0005 |

\* cited by examiner

*Primary Examiner* — Lisa M Caputo
*Assistant Examiner* — Nigel H Plumb
(74) *Attorney, Agent, or Firm* — WPAT, P.C., Intellectual Property Attorneys; Anthony King

(57) ABSTRACT

The present disclosure provides a pressure sensor, including a chamber and a film. The chamber includes a first wall with a first electrode and a second wall with a second electrode. The first wall faces the second wall, and the first electrode and the second electrode respectively include conductive or semiconductive material. The film lines a surface inside the chamber exclusive of the first electrode and the second electrode for blocking outgassing entering the chamber from the surface. A method of manufacturing the pressure sensor is also disclosed.

20 Claims, 32 Drawing Sheets

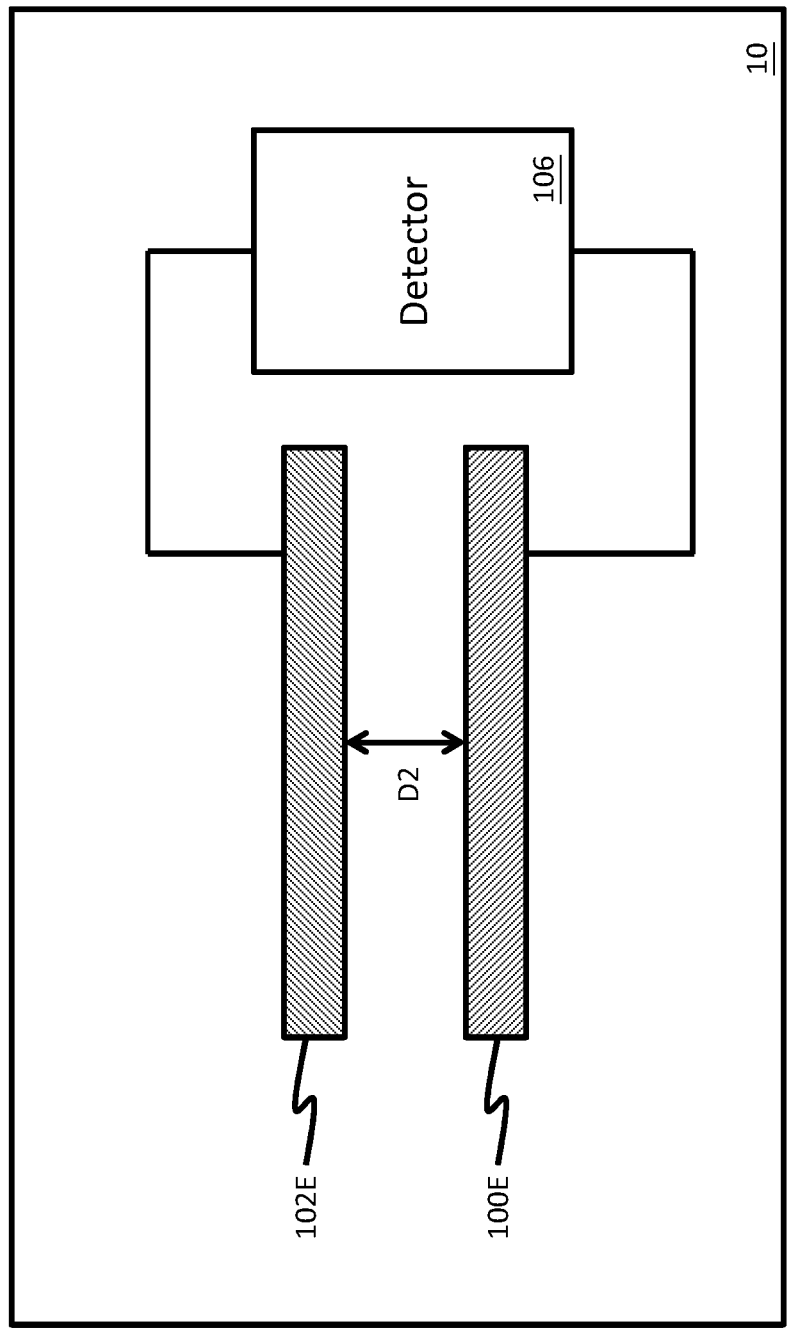

PRESSURE SENSOR AND MANUFACTURING METHOD THEREOF

BACKGROUND

A capacitive-based pressure sensor is one kind of sensor used for sensing changes in pressure. For some capacitive-based pressure sensors, there is an inner space within the sensor, and a stable reference pressure is maintained in the inner space. The stable reference pressure provides a reference point that allows the sensor to sense a pressure difference between the inner space and an outer space.

However, unwanted outgassing from the sidewalls of the inner space or from the residue of oxide within the inner space may vary the stable reference pressure maintained in the inner space, and can disrupt the balance of the reference point needed for the sensor to sense the pressure difference. In brief, outgassing may lead to malfunction of the sensor.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3C is a schematic view of a pressure sensor in operation in accordance with some embodiments of the present disclosure.

DETAILED DESCRIPTION

Figure 1A:
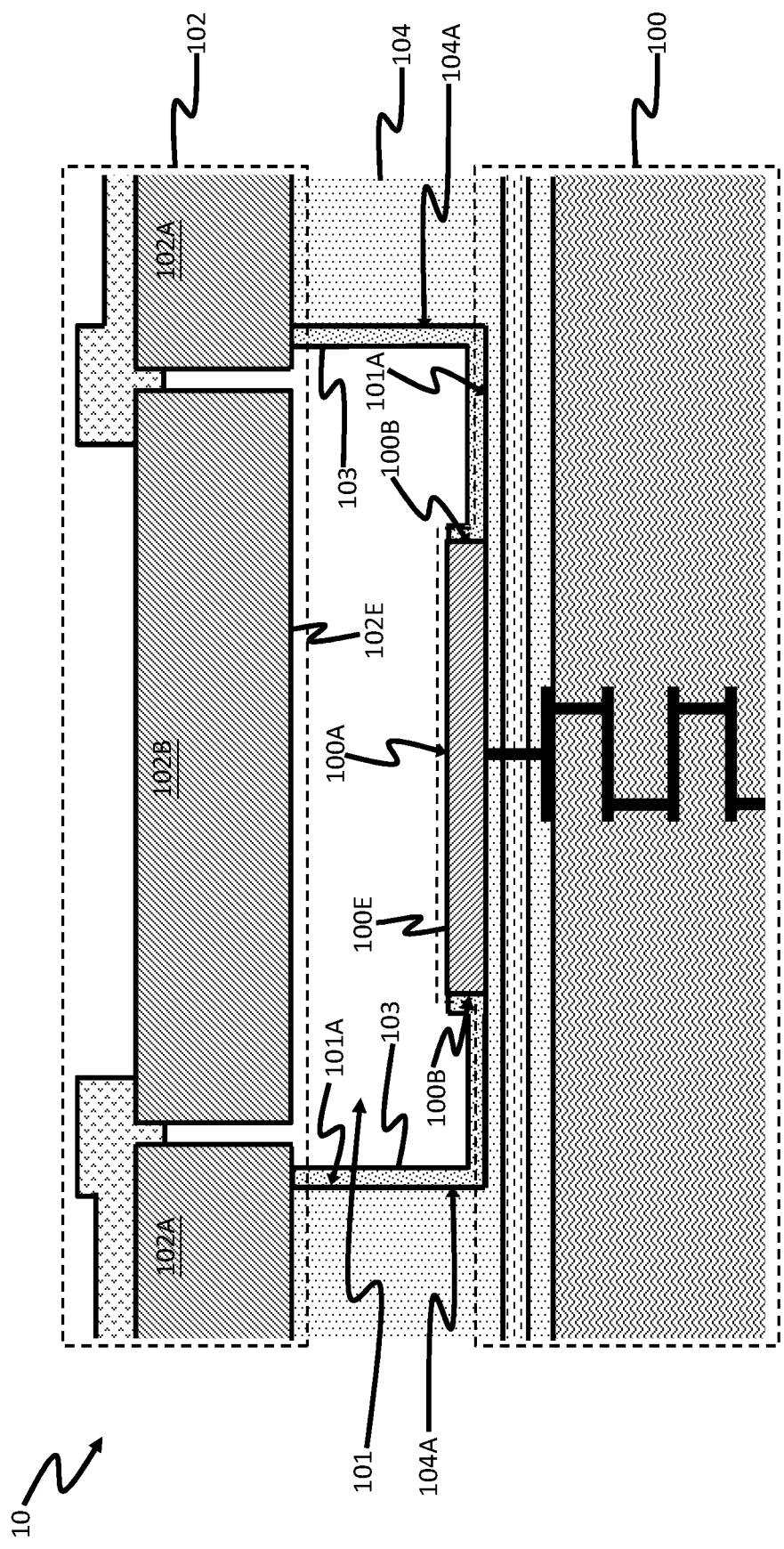
FIGS. 1A to 1D are cross-sectional views of a pressure sensor in accordance with some embodiments of the present disclosure

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a cross-sectional view of a pressure sensor 10 in accordance with some embodiments of the present disclosure. The pressure sensor 10 includes a semiconductor device 100, a cavity 101, a pressure-sensing element 102 and a first film 103.

The semiconductor device 100 has a first electrode 100E. The cavity 101 is formed over the semiconductor device 100 and exposes the first electrode 100E. In other words, the first electrode 100E of the semiconductor device 100 is exposed within the cavity 101. The pressure-sensing element 102 is formed over the cavity 101, and is opposite to the semiconductor device 100.

In some embodiments, outgassing may enter the cavity 101 from an inner surface 101A of the cavity 101. Therefore, the first film 103 is introduced to cover the inner surface 101A of the cavity 101 for blocking the potential outgassing. In some embodiments, the first electrode 100E of the semiconductor device 100 and the pressure-sensing element 102 are operated cooperatively as a capacitor. The first film 103 covers the inner surface 101A exclusive of the first electrode 100E and the pressure-sensing element 102 for preventing the performances of the capacitor from being affected. In other words, the first film 103 covers portions of the inner surface 101A not including the first electrode 100E and the pressure-sensing element 102. In some embodiments, the first film 103 includes silicon nitride.

In some embodiments, the cavity 101 is defined as a chamber in the pressure sensor 10. The semiconductor device 100 with the first electrode 100E forms a first wall for the chamber. The pressure-sensing element 102 forms a second wall for the chamber. In some embodiments, the semiconductor device 100 is opposite to the pressure-sensing element 102 so that the first wall of the chamber faces the second wall of the chamber.

In some embodiments, the pressure-sensing element 102 forms the second wall and includes a second electrode 102E. The second electrode 102E is opposite to the first electrode 100E of the semiconductor device 100 in the cavity 101. The first electrode 100E and the second electrode 102E respectively include conductive or semiconductive material for being operated cooperatively as a capacitor.

In some embodiments, the first electrode 100E of the semiconductor device 100 includes conductive material such as metal or metallic alloy, and the second electrode 102E of the pressure-sensing element 102 includes semiconductive material such as silicon. In some embodiments, the first electrode 100E of the semiconductor device 100 includes semiconductive material such as silicon.

The first electrode 100E and the second electrode 102E are separated by a non-conductive region. In some embodiments, the non-conductive region is the cavity 101 formed in a dielectric layer 104. The dielectric layer 104 is disposed between the semiconductor device 100 and the pressure-sensing element 102. The first electrode 100E and the second electrode 102E are exposed within the cavity 101.

In some embodiments, the pressure-sensing element 102 includes a first part 102A and a second part 102B. The first part 102A of the pressure-sensing element 102 is substantially used for bonding to the dielectric layer 104. The second part 102B of the pressure-sensing element 102 is substantially used as the second electrode 102E and for covering the cavity 101. In some embodiments, due to the bond of the pressure-sensing element 102 and the dielectric layer 104, the first film 103 contacts a portion of the first part 102A of the pressure-sensing element 102. The first film 103 does not fully cover the first part 102A of the pressure-sensing element 102.

In some embodiments, the dielectric layer 104 and the semiconductor device 100 include oxide material so that outgassing may be generated in the dielectric layer 104 or in the semiconductor device 100. Outgassing may enter the chamber from the dielectric layer 104 or the semiconductor device 100. To block potential entry of the outgassing into the chamber, the first film 103 lines a surface inside the chamber. The surface inside the chamber includes surfaces of the dielectric layer 104 and part of the semiconductor device 100.

In some embodiments, properties of the first film 103 and the dielectric layer 104 are different. For example, the material densification of the first film 103 may be higher than the material densification of the dielectric layer 104. The density of the first film 103 may be higher than the density of the dielectric layer 104 as well. Accordingly, the porosity of the first film 103 may be lower than the porosity of the dielectric layer 104. Therefore, as for the first film 103 and the dielectric layer 104, residual material generated from preceding operations could be trapped in a matrix of the dielectric layer 104. The residual material may include carbon, fluorine, chlorine, etc. In some cases, the first film 103 provides better thermal stability than the dielectric layer 104. Based on the mentioned properties, the first film 103 is superior to the dielectric layer 104 for avoiding the generation of outgassing under thermal processes. In some embodiments, the ratio of the density of the first film 103 to the density of the dielectric layer 104 is about 1.05 to 1.5. In some embodiments, the ratio of the density of the first film 103 to the density of the dielectric layer 104 is about 1.05 to 1.3. In some embodiments, the ratio of the density of the first film 103 to the density of the dielectric layer 104 is about 1.2 to 1.8.

In some embodiments, the inner surface 101A covered by the first film 103 includes a surface of the cavity 101 exclusive of surfaces of the first electrode 100E and the second electrode 102E. In other words, the inner surface 101A covered by the first film 103 includes the surface of the cavity 101 but does not include surfaces of the first electrode 100E and the second electrode 102E. In detail, the inner surface 101A covered by the first film 103 includes surfaces of the dielectric layer 104 and the semiconductor device 100 within the cavity 101. The inner surface 101A does not include a surface, which faces toward the second electrode 102E, of the first electrode 100E. The inner surface 101A does not include a surface, which faces to the first electrode 100E, of the second electrode 102E. Therefore, potential outgassing from the dielectric layer 104 or the semiconductor device 100 into the cavity 101 can be blocked by the first film 103, and the performance of the capacitor including the first electrode 100E and the second electrode 102E is not affected.

In some embodiments, the dielectric layer 104 is divided by a space. Two edges, which are opposite to each other, of the dielectric layer 104 define two surfaces 104A of the dielectric layer 104 respectively. In some embodiments, the two surfaces 104A of the dielectric layer 104 are fully covered by the first film 103.

In some embodiments, the first electrode 100E is disposed on and extends along an outer layer of the semiconductor device 100. A surface 100A of the first electrode 100E facing toward the second electrode 102E is defined along the outer layer of the semiconductor device 100. For correspondingly operating with the second electrode 102E, the surface 100A of the electrode 100E should not be covered by the first film 103.

In some embodiments, each of two surfaces 100B of the first electrode 100E is defined at either end of the first electrode 100E. The two surfaces 100B respectively face toward the two surfaces 104A of the dielectric layer 104 within the cavity 101. The two surfaces 100B of the first electrode 100E can be partially covered by the first film 103 due to a deposition of the first film 103.

In some embodiments, the pressure sensor 10 is a capacitive-based pressure sensor. The pressure-sensing element 102 is a silicon membrane of the capacitive-based pressure sensor. The semiconductor device 100 is a complementary metal-oxide-semiconductor (CMOS) device for used in capacitive-based pressure sensors. The first electrode 100E and the second electrode 102E are operated cooperatively as a capacitor of the capacitive-based pressure sensor. The cavity 101 is sealed in the capacitive-based pressure sensor for maintaining a reference pressure.

In some embodiments, the reference pressure kept in the cavity 101 is a vacuum pressure such as: Low Vacuum, defined as $1 \times 10^5$ PA to $3 \times 10^3$ PA; Medium Vacuum, defined as $3\times10^3$ PA to $1\times10^{-1}$ PA; High Vacuum, defined as $1\times10^{-1}$ PA to $1\times10^{-7}$ PA; Ultra High Vacuum, defined as $1\times10^{-7}$ PA to $1\times10^{-10}$ PA; Extremely High Vacuum, defined as $1\times10^{-4}$ to $3\times10^{-15}$; or some user-defined vacuum pressure.

Figure 1B:
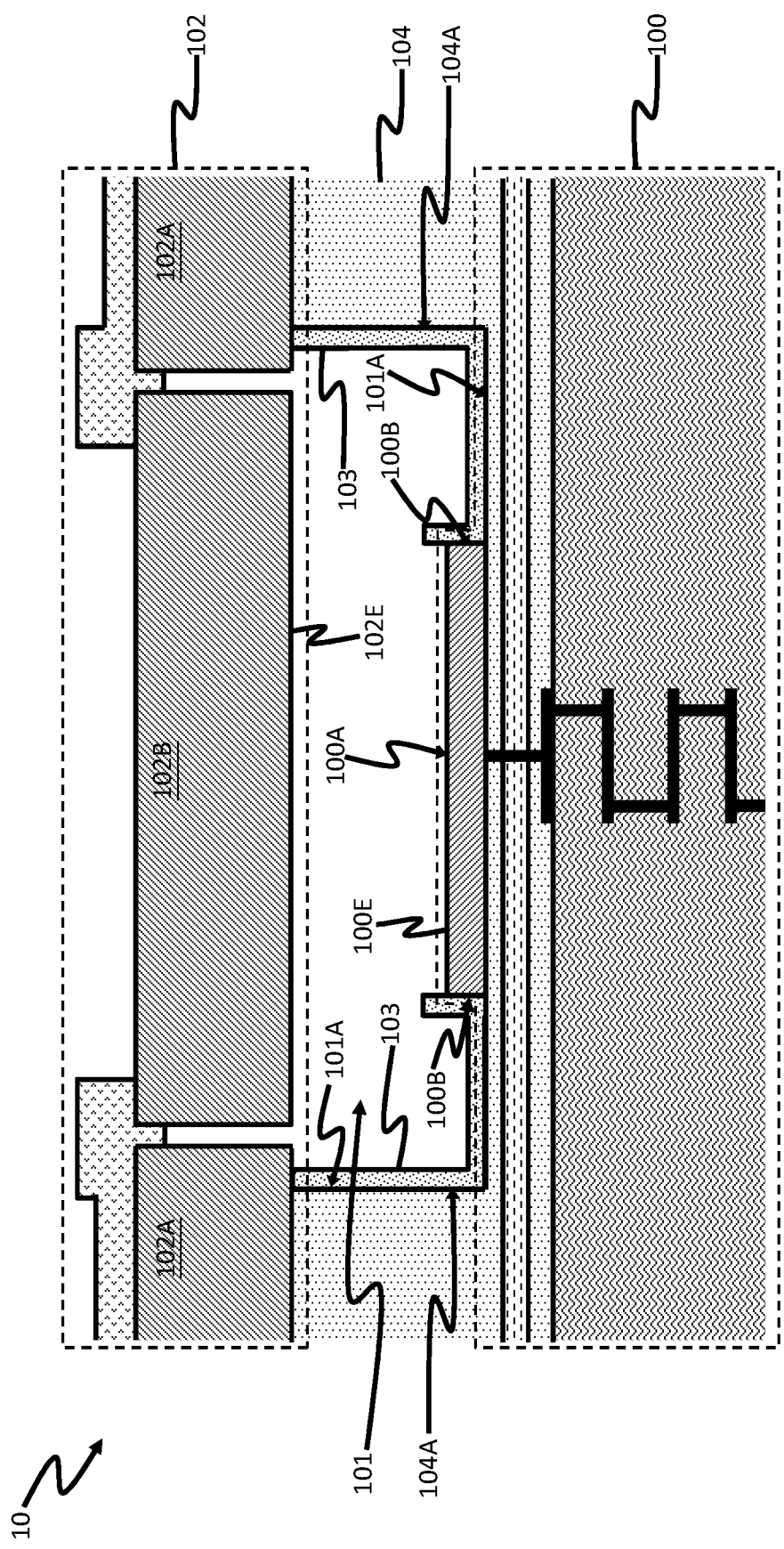

FIG. 1B is a cross-sectional view of the pressure sensor 10 in accordance with some embodiments of the present disclosure. The film 103 can be formed by low resolution lithographical and etching process without affecting the performance of the first electrode 100E. As shown in FIG. 1B, the film 103 includes protrusions higher than the surface 100A of the first electrode 100E.

Figure 1C:
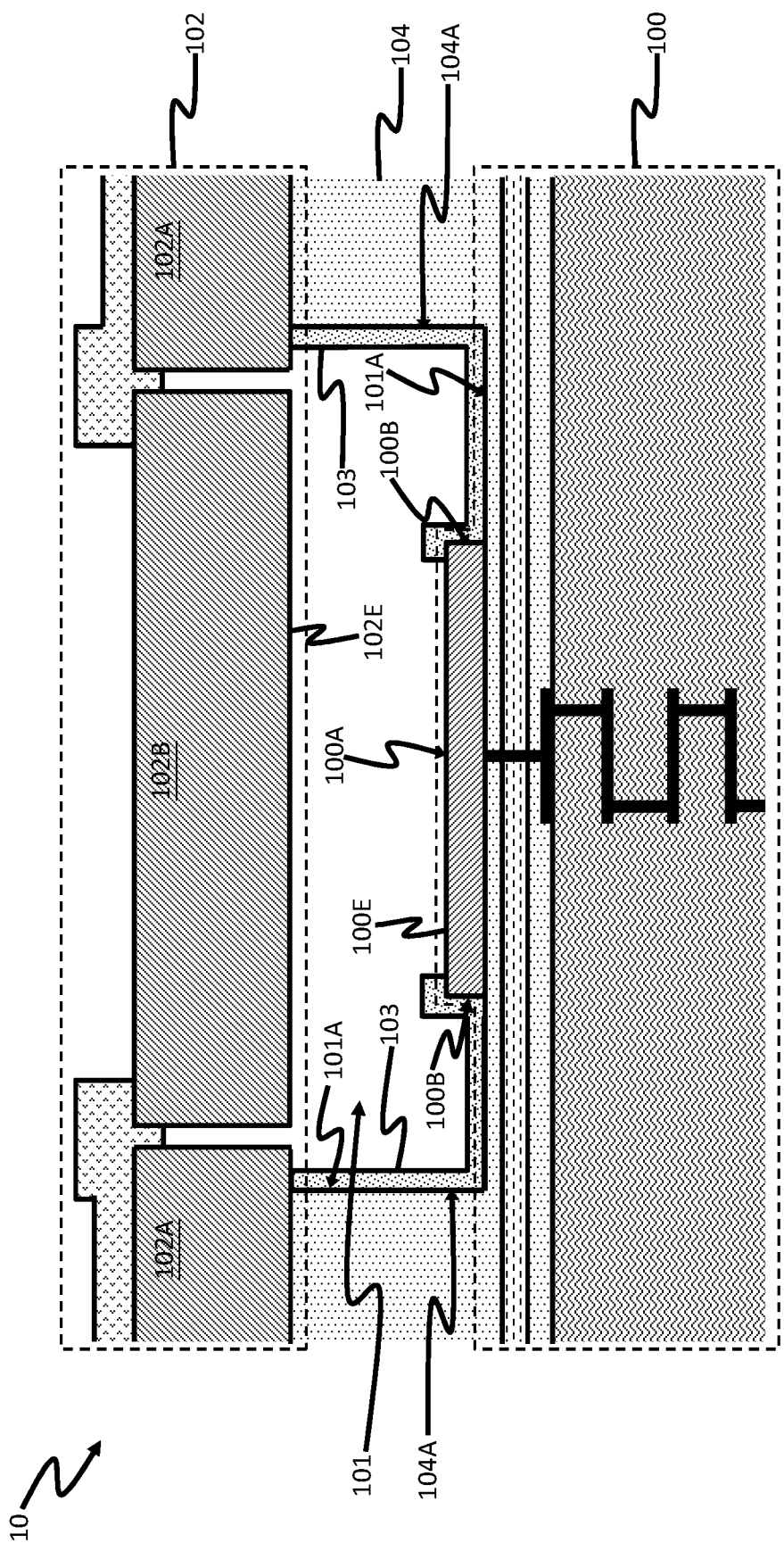

FIG. 1C is a cross-sectional view of the pressure sensor 10 in accordance with some embodiments of the present disclosure. The film 103 can be formed by low resolution lithographical and etching process without affecting the performance of the first electrode 100E. As shown in FIG. 1C, the inner surface 101A of the cavity 101 covered by the film 103 includes the surfaces 104A of the dielectric layer 104, the surfaces of the semiconductor device 100 and the surfaces 100B of the first electrode 100 in the cavity 101. The inner surface 101A of the cavity 101 covered by the film 103 further includes a portion of the surface 100A of the first electrode 100E.

In some embodiments, low resolution lithographical and etching process can be performed for forming the film 103. Therefore, the film 103 may include the protrusions higher than the surface 100A of the first electrode 100E. Otherwise, the film 103 covers parts, which are adjacent to the two ends of the first electrode 100E, of the surface 100A. In these cases, because most parts of the first electrode 100E are still exposed in the cavity 101, the performance of capacitor including the first electrode 100E is not affected.

Figure 1D:
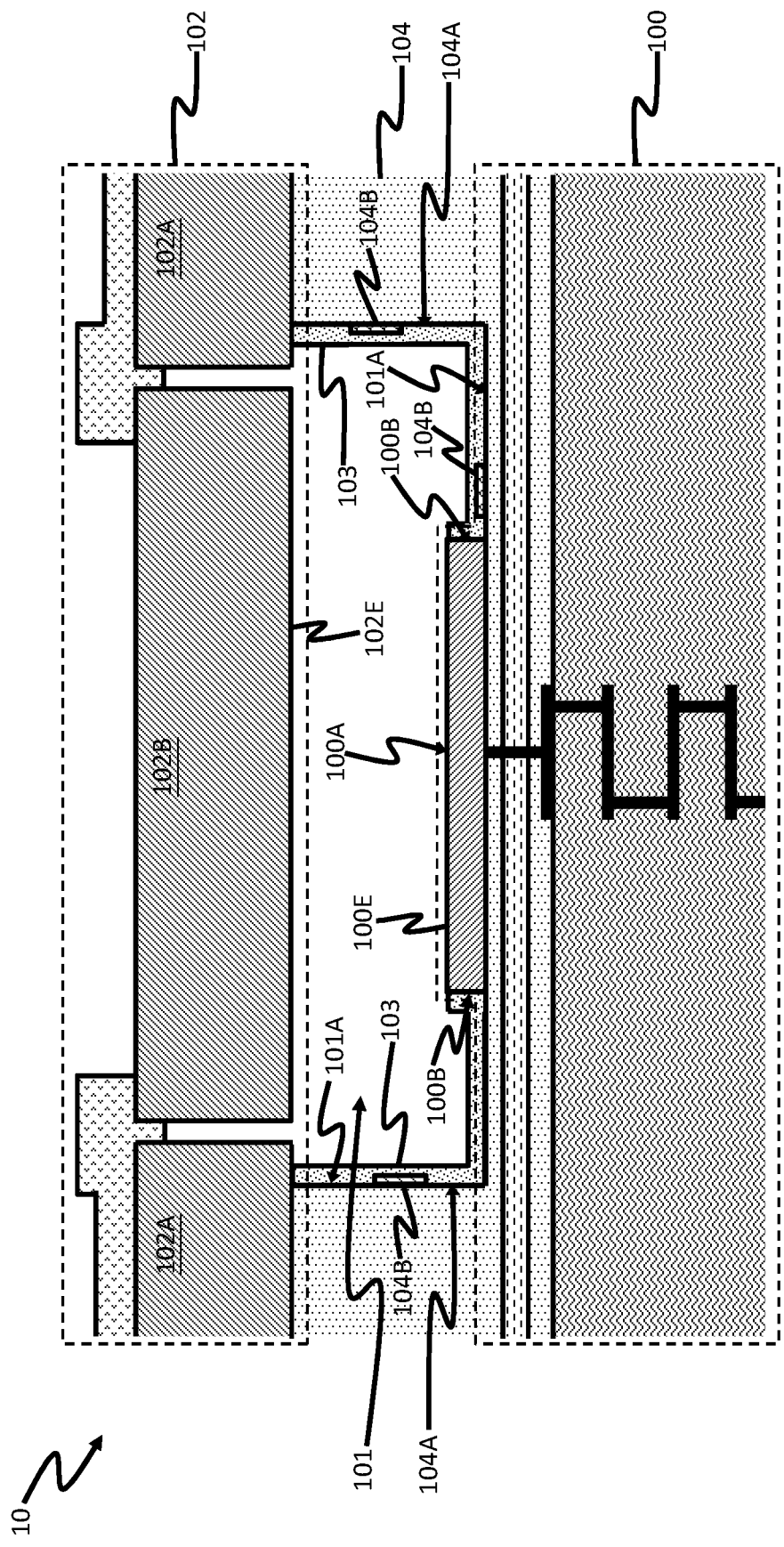

FIG. 1D is a cross-sectional view of the pressure sensor 10 in accordance with some embodiments of the present disclosure. After forming the dielectric layer 104, cluster of residues 104B may be remained on the surfaces of the dielectric layer 104. The cluster of residues 104B includes material of carbon which may cause outgassing after thermal processes. Accordingly, the first film 103 is used for covering the cluster of residue 104B while covering the surfaces 104A of the dielectric layer 104. Therefore, potential outgassing from the cluster of residues 104B can be blocked by the first film 103 as well.

Figure 2A:
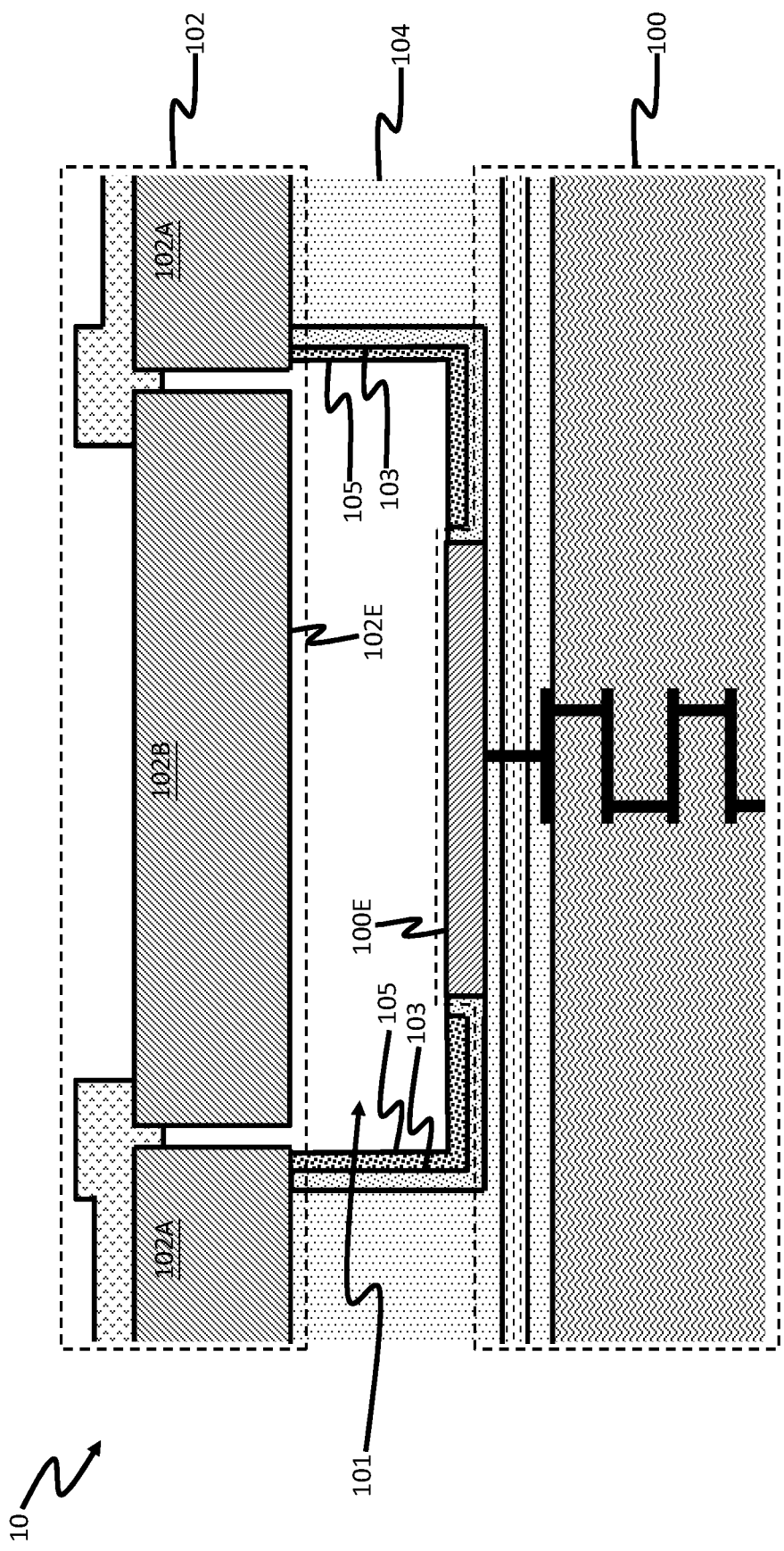
FIGS. 2A to 2C are cross-sectional views of a pressure sensor in accordance with some embodiments of the present disclosure.

FIG. 2A is a cross-sectional view of the pressure sensor 10 in accordance with some embodiments of the present disclosure. A second film 105 is introduced for improving the blocking of outgassing. As shown in FIG. 2A, the pressure sensor 10 includes the second film 105. The second film 105 covers the first film 103 within the cavity 101. In some embodiments, the first film 103 and the second film 105 include different materials, and are formed as different layers.

In some embodiments, due to the bond of the pressure-sensing element 102 and the dielectric layer 104, the second film 105 contacts a portion of the first part 102A of the pressure-sensing element 102. The second film 105 does not fully cover the first part 102A of the pressure-sensing element 102.

Figure 2B:
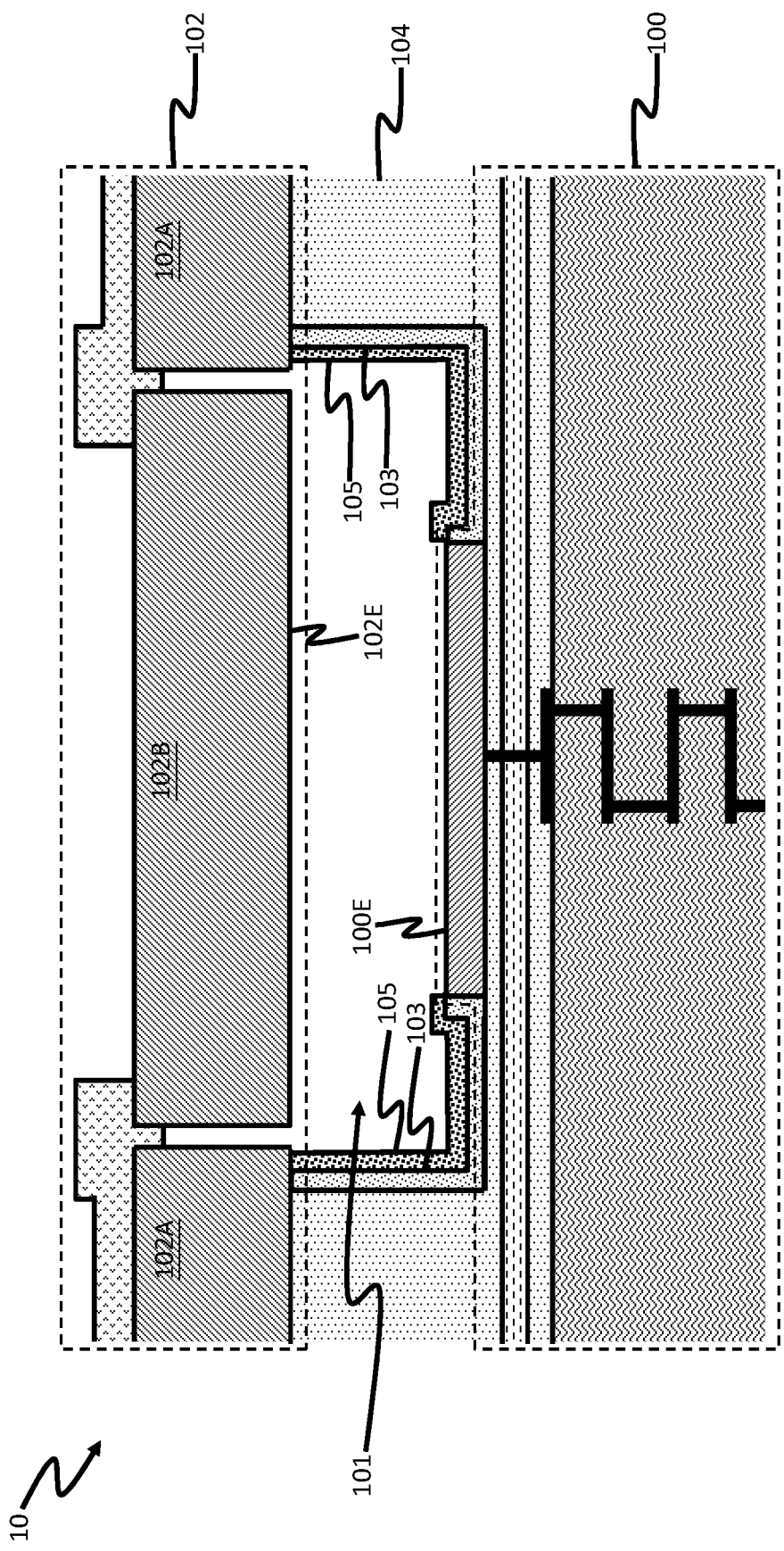

FIG. 2B is a cross-sectional view of the pressure sensor 10 in accordance with some embodiments of the present disclosure. The first film 103 is fully covered by the second film 105 within the cavity 101.

Figure 2C:
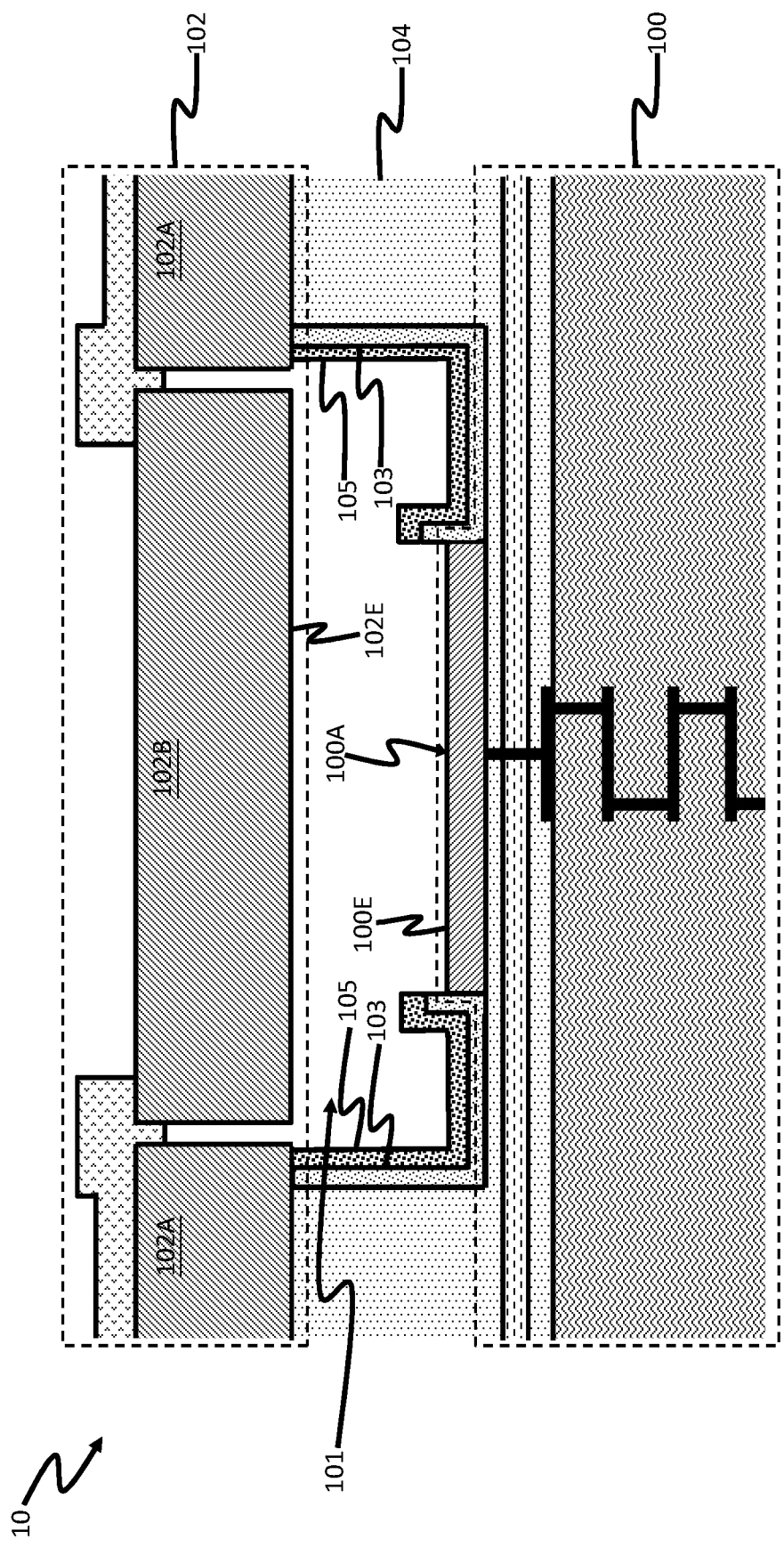

FIG. 2C is a cross-sectional view of the pressure sensor 10 in accordance with some embodiments of the present disclosure. After the lithographical and etching process, the first film 103 may have protrusions higher than the surface 100A of the semiconductor device 100. Therefore, after forming the second film 105 on the first film 103, the first film 103 with the protrusions is covered by the second film 105.

Figure 3A:
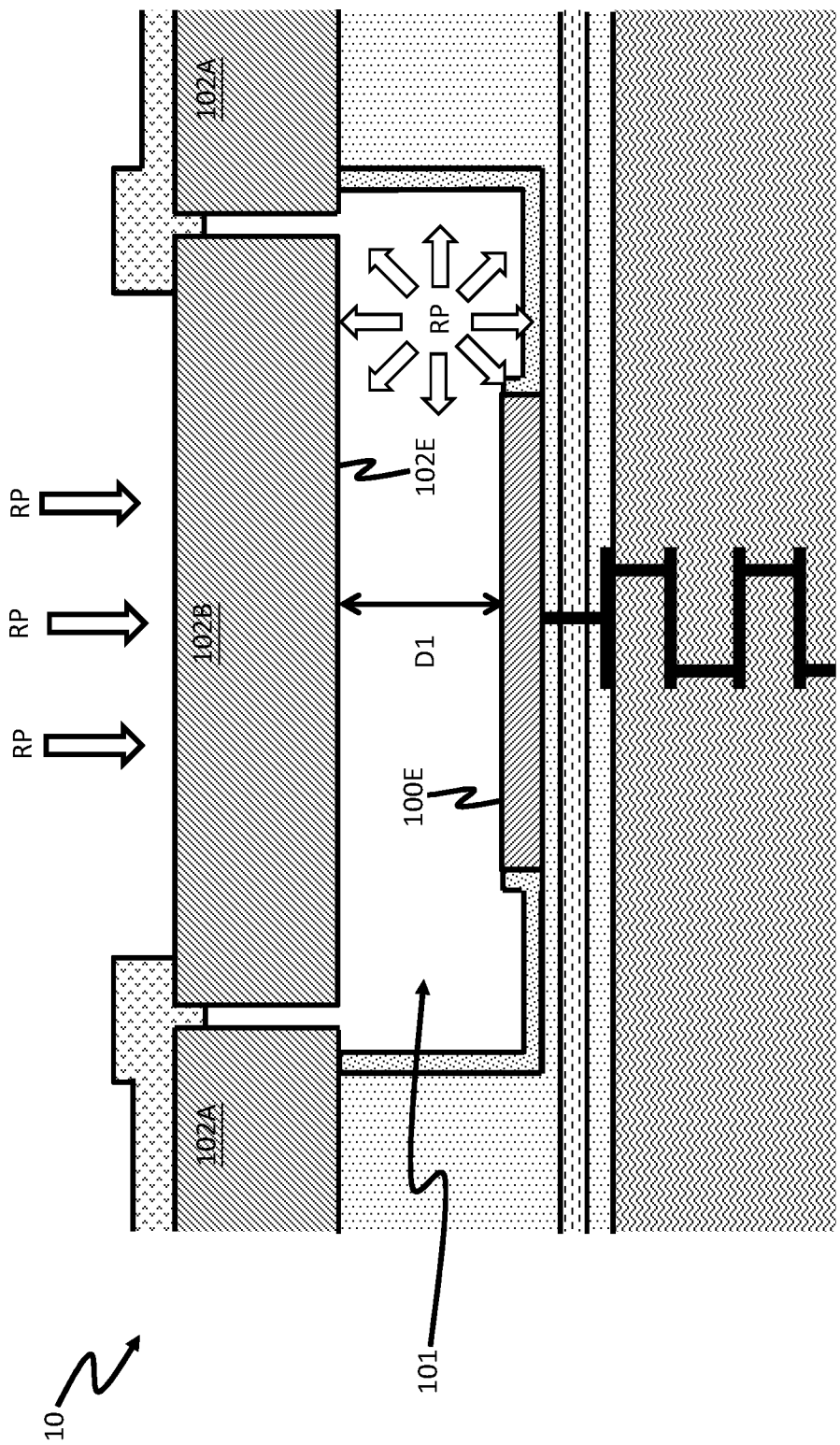
FIGS. 3A and 3B are cross-sectional views of a pressure sensor in operation in accordance with some embodiments of the present disclosure.
Figure 3B:
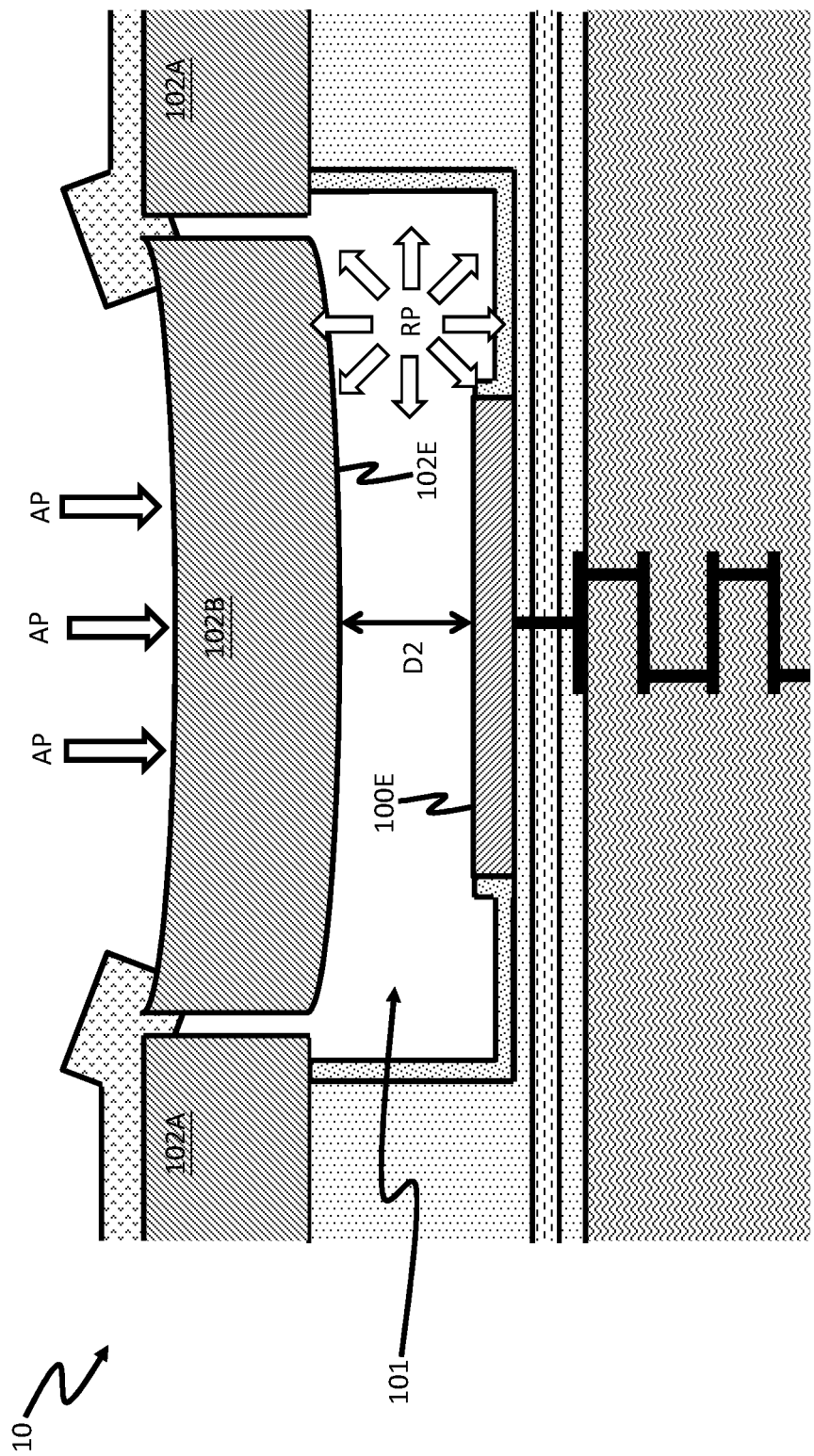

FIGS. 3A and 3B are cross-sectional views of the pressure sensor 10 in operation in accordance with some embodiments of the present disclosure. FIG. 3C is a schematic view of the pressure sensor 10 in operation in accordance with some embodiments of the present disclosure.

In some embodiments, the pressure sensor 10 further includes a detector 106. The detector 106 is electrically connected to the first electrode 100E and the second electrode 102E. The cavity 101, serving as the chamber, keeps a reference pressure RP inside. When a pressure outside the pressure sensor 10 is substantially equal to the reference pressure RP, the pressure-sensing element 102 is substantially flat and the first electrode 100E is at a distance D1 from the second electrode 102E.

In some embodiments, when an atmospheric pressure AP such as a normal atmospheric pressure outside the pressure sensor 10 is applied to the pressure sensor 10, a pressure difference exists between the reference pressure RP in the chamber and the applied atmospheric pressure AP. As a result of the pressure difference, the pressure-sensing element 102 is deformed. It should be noted that the normal atmospheric pressure refers to about $1.013\times10^5$ PA.

In some embodiments, based on the deformation of the pressure-sensing element 102, the distance D1 between the first electrode 100E and the second electrode 102E changes to a distance D2. Therefore, capacitance stored in the capacitor, which includes the first electrode 100E and the second electrode 102E, changes due to the change of the distance between the first electrode 100E and the second electrode 102E. The detector 106 then detects a capacitance change, and determines a pressure change based on the capacitance change.

In some embodiments, the reference pressure RP in the cavity 101 is a vacuum pressure. The applied atmospheric pressure AP is an atmospheric pressure that changes with the environment. Therefore, as the environmental pressure changes, the detector 106 can determine pressure changes while the reference pressure RP is fixed and the applied atmospheric pressure AP changes with changes in the environment.

Figure 4:
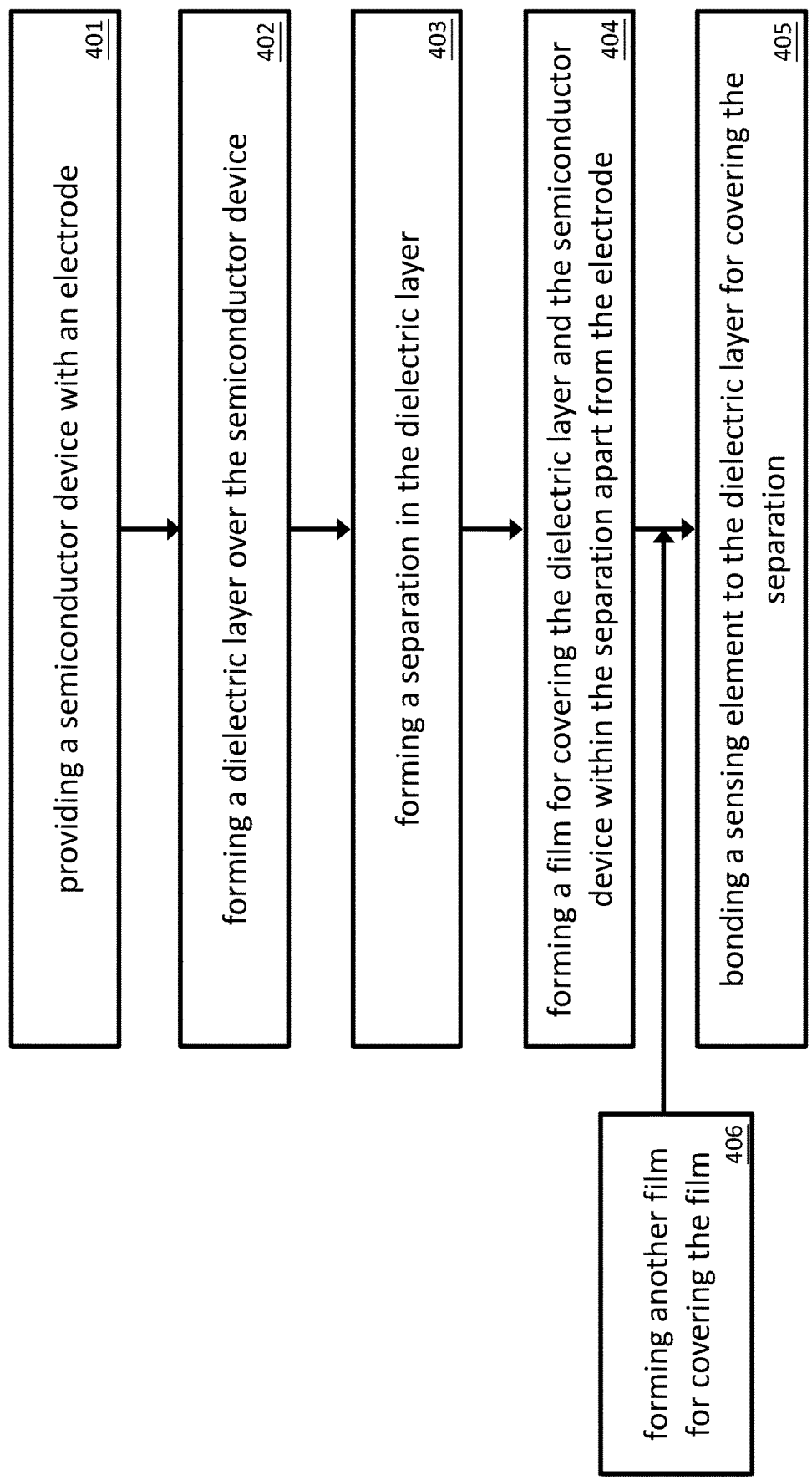
FIG. 4 is a flowchart illustrating a method for manufacturing a pressure sensor in accordance with some embodiments of the present disclosure.

Some embodiments of the present disclosure provide a pressure sensor manufacturing method as shown in FIG. 4. The pressure sensor manufacturing method includes: operation 401, in which a semiconductor device with an electrode is provided; operation 402, in which a dielectric layer is formed over the semiconductor device; operation 403, in which a space is formed in the dielectric layer, wherein the electrode is exposed within the space; operation 404, in which a film for covering the dielectric layer and the semiconductor device is formed within the space exclusive of the electrode, i.e., the film is formed within the space not including the electrode; and operation 405, in which a pressure-sensing element is bonded to the dielectric layer for covering the space.

In some embodiments, operation 404, in which the film is formed, comprises two sub-operations: (i) forming the film for covering the dielectric layer and the semiconductor device within the space; and (ii) removing a portion of the film for exposing the electrode of the semiconductor device. In some embodiments, operation 406, in which another film is formed for covering the film, can be optionally executed before operation 405.

The above methods are illustrated in more detail in the following description by providing various embodiments.

However, the description meant to be illustrative only, and is not intended to limit the present disclosure.

Figure 5A:
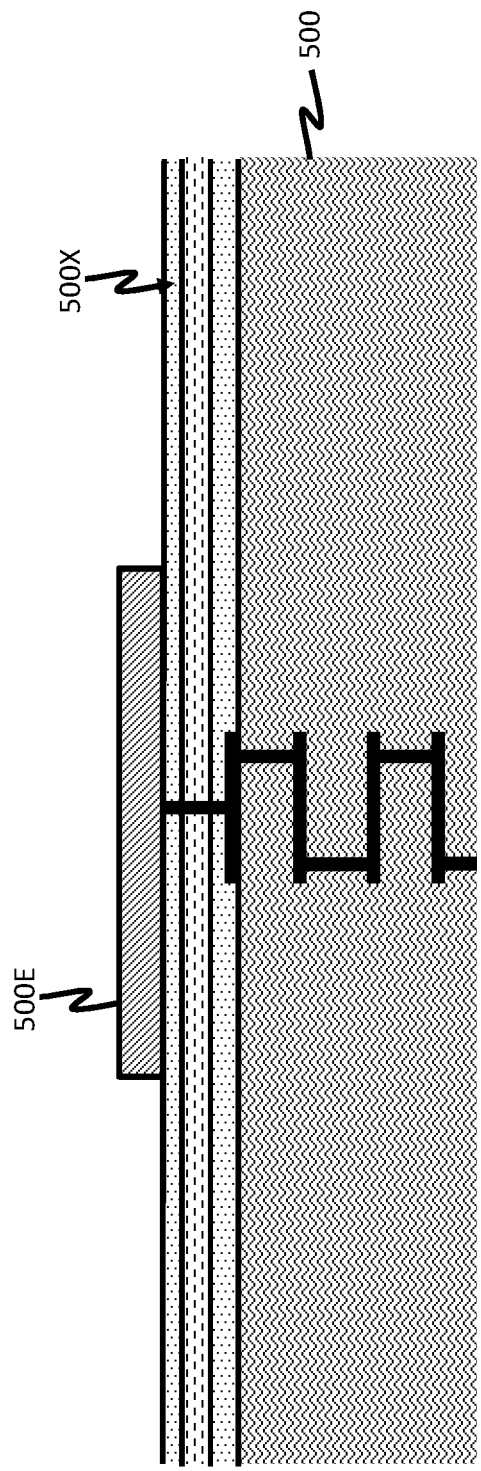
FIGS. 5A to 5U are cross-sectional views of a pressure sensor at various stages of manufacture in accordance with some embodiments of the present disclosure.

To illustrate operation 401 of the pressure sensor manufacturing method, FIG. 5A is provided in accordance with some embodiments of the present disclosure. As shown in FIG. 5A, a semiconductor device 500 is provided. The semiconductor device 500 includes a first electrode 500E. In some embodiments, the semiconductor device 500 has a CMOS part. The first electrode 500E is electrically connected to the CMOS part via metal lines within inter-metal dielectric (IMD) layers. In some embodiments, a layer 500X including oxide is formed as an outer layer of the semiconductor device 500. The first electrode 500E lies on a surface of the layer 500X.

Figure 5B:
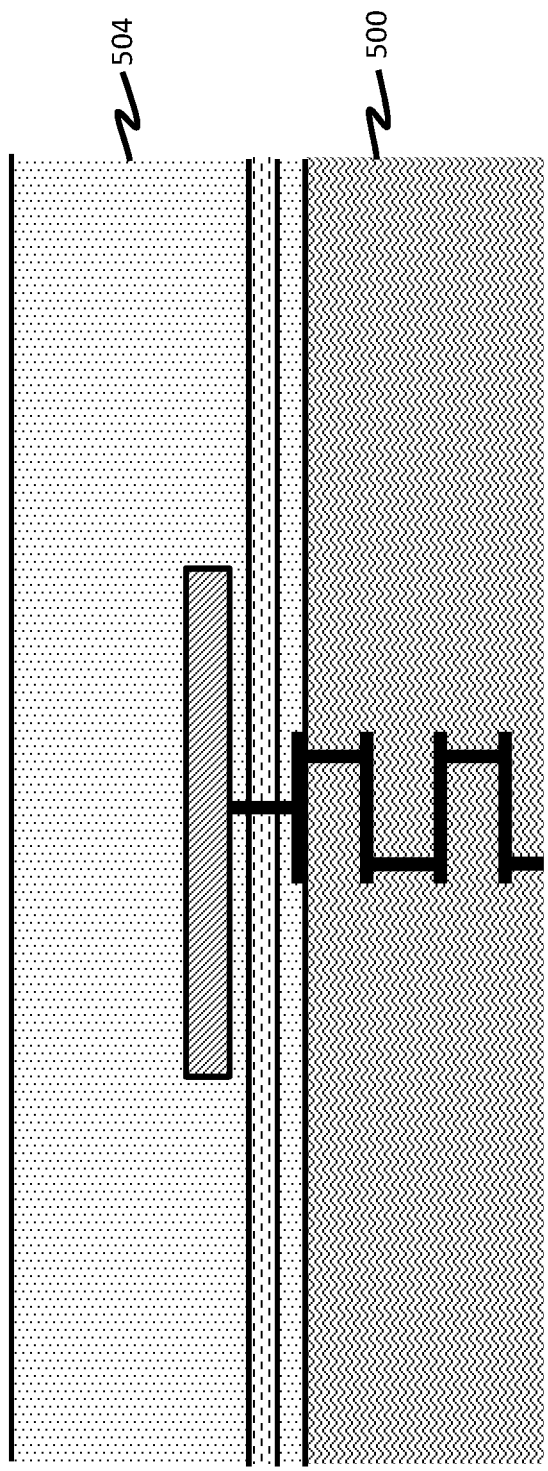

FIG. 5B illustrates operation 402 of the pressure sensor manufacturing method in accordance with some embodiments of the present disclosure. As shown in FIG. 5B, a dielectric layer 504 is formed over the semiconductor device 500. In some embodiments, the dielectric layer 504 includes oxide. Further, the formation of the dielectric layer 504 is achieved by: depositing oxide on the semiconductor device 500; and applying a chemical mechanical planarization (CMP) procedure to form a planar oxide layer.

Figure 5C:
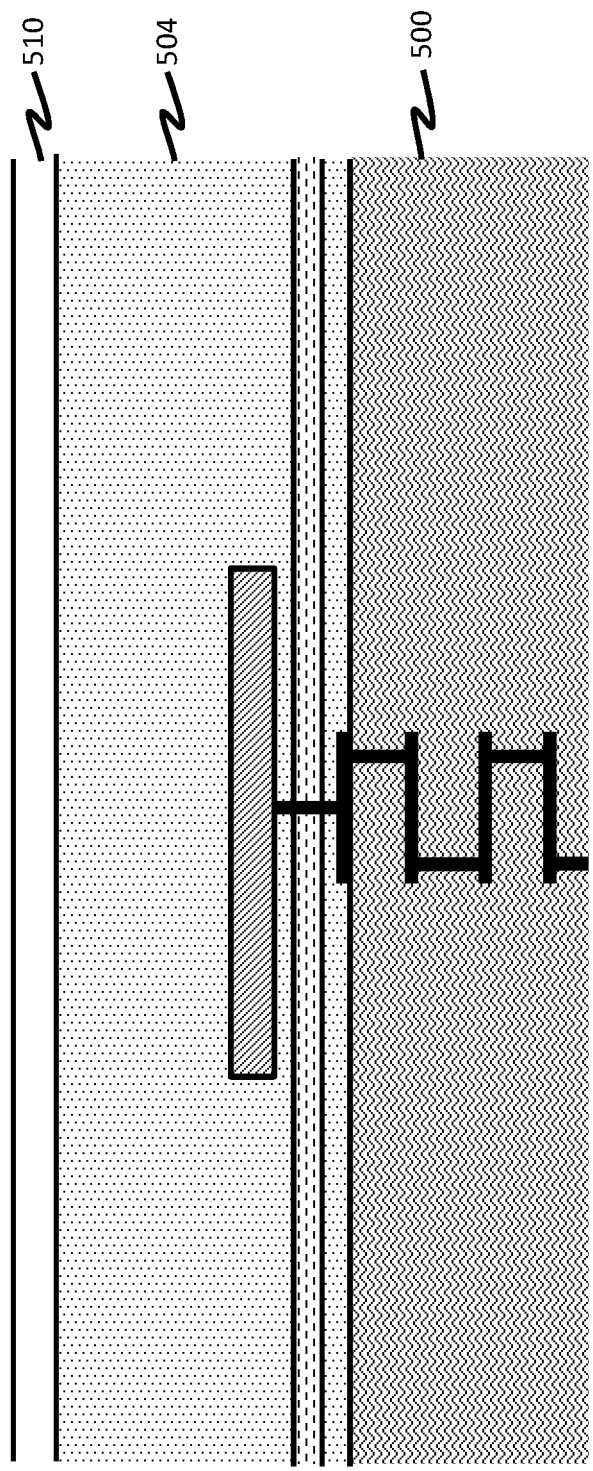
Figure 5D:
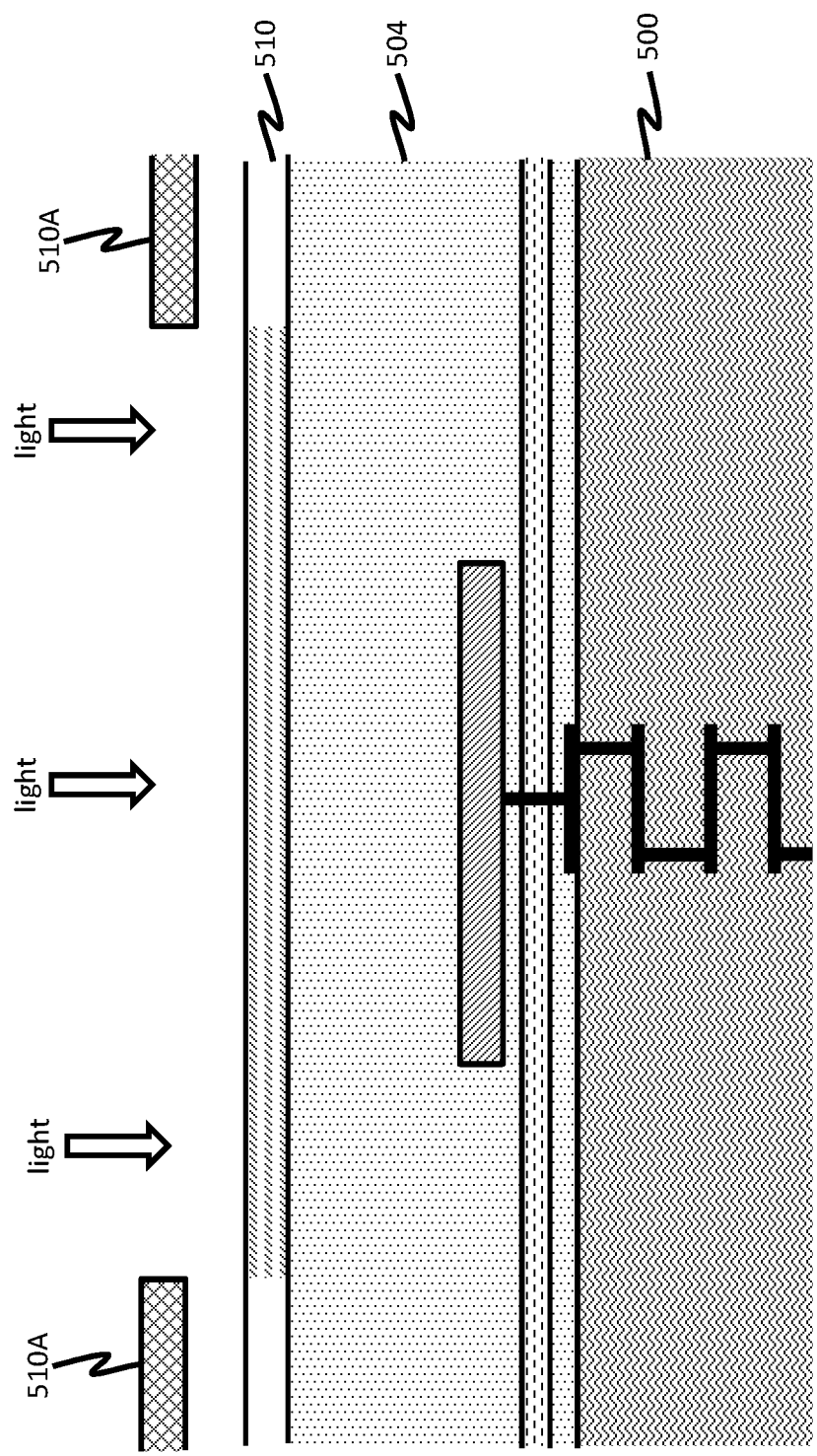
Figure 5E:
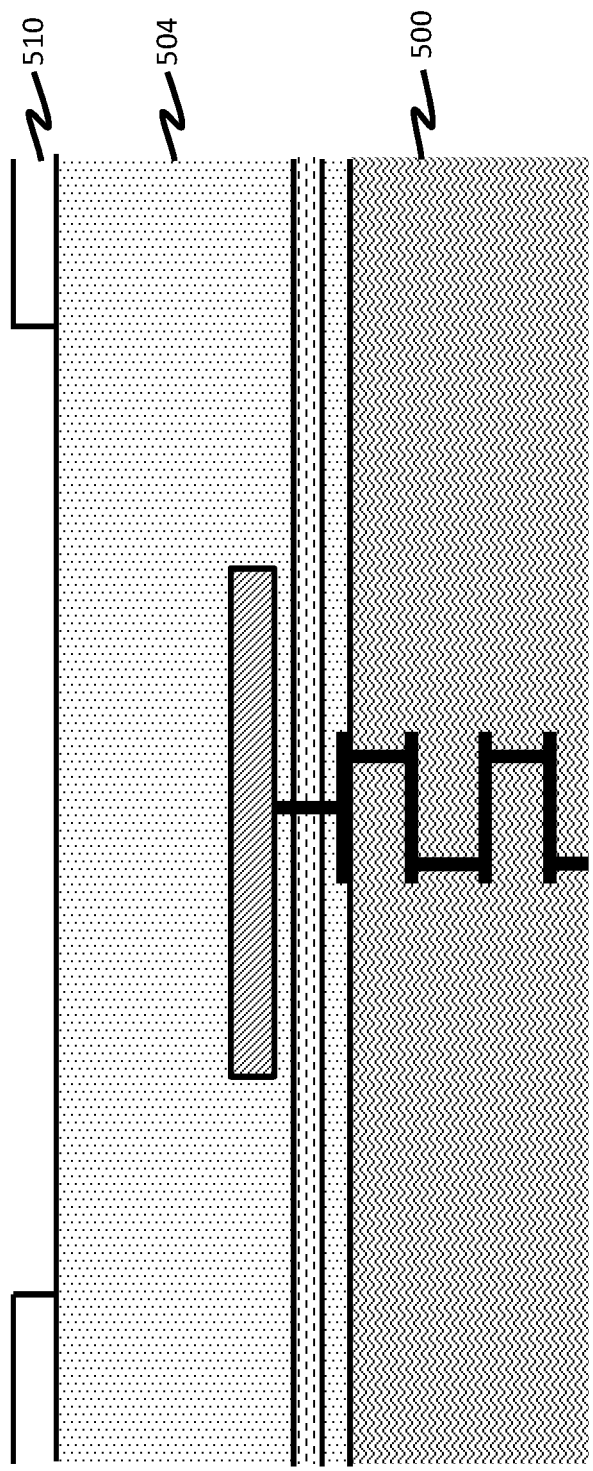

FIGS. 5C to 5F illustrate operation 403 of the pressure sensor manufacturing method in accordance with some embodiments of the present disclosure. As shown in FIG. 5C, a radiation light sensitive coating layer 510 is formed over the dielectric layer 504. A lithographical and etching process is performed to pattern the radiation light sensitive coating layer 510. In FIGS. 5D and 5E, a patterned mask 510A is provided over the radiation light sensitive coating layer 510. In some embodiments, a portion of the radiation light sensitive coating layer 510, upon exposure to the light passing through an opening in the patterned mask 510A, undergoes a cross linking process. As a result, the cross-linked portion is etched away.

Figure 5F:
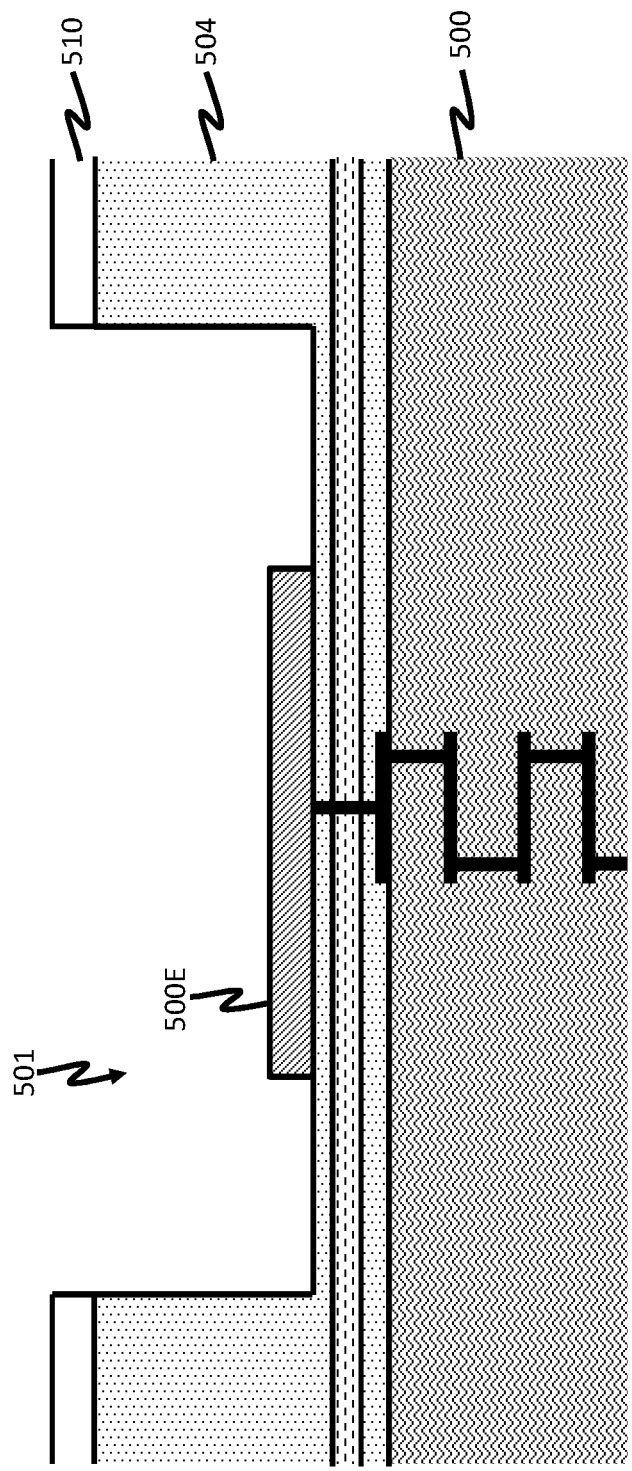
Figure 5G:
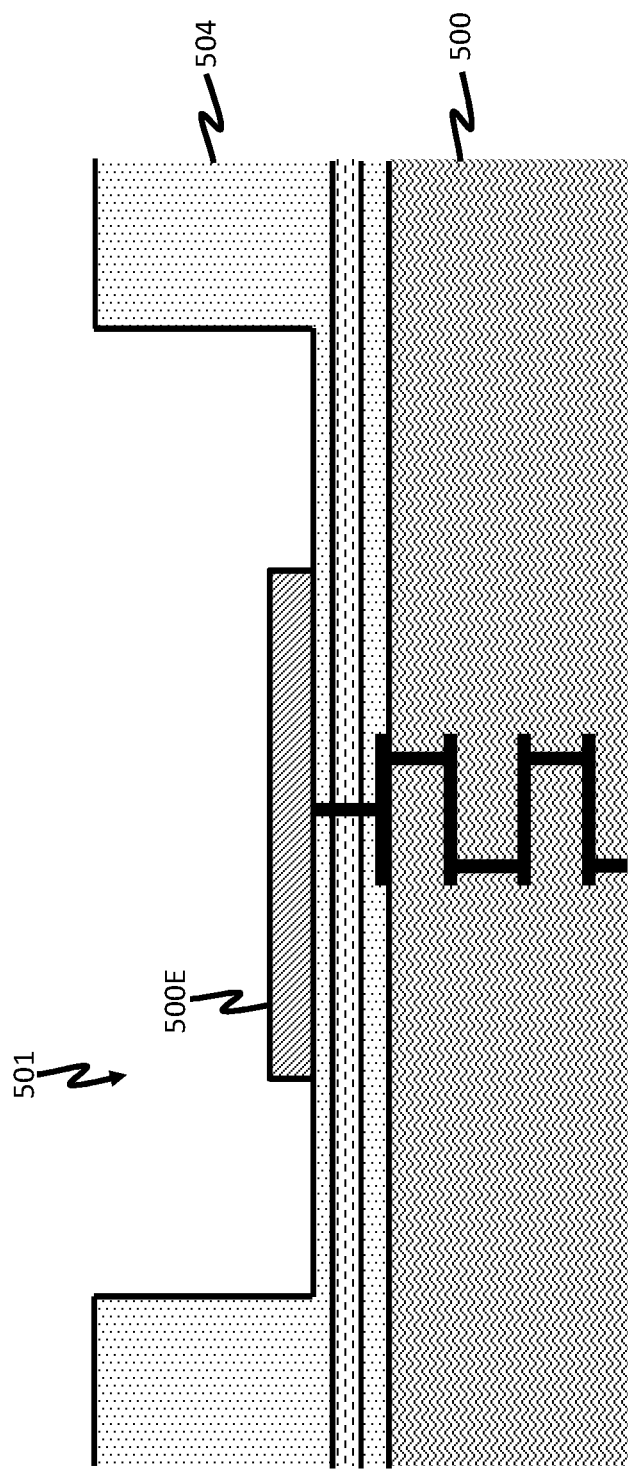

As shown in FIG. 5F, a portion of the dielectric layer 504 not protected by the radiation light sensitive coating layer 510 is removed. In FIG. 5G, the remainder of the radiation light sensitive coating layer 510 is removed. Accordingly, a space 501 is formed in the dielectric layer 504, and the first electrode 500E is exposed within the space 501.

In some embodiments, another radiation light sensitive coating layer having different characteristics and another patterned mask can be used to achieve the desired patterning result on the dielectric layer 504. In some embodiments, the radiation light sensitive coating layer 510 may include a positive tone resist or a negative tone resist, and the patterned mask 510A for patterning the dielectric layer 504 can be adjusted based on the positive tone resist or the negative tone resist of the radiation light sensitive coating layer 510.

Figure 5H:
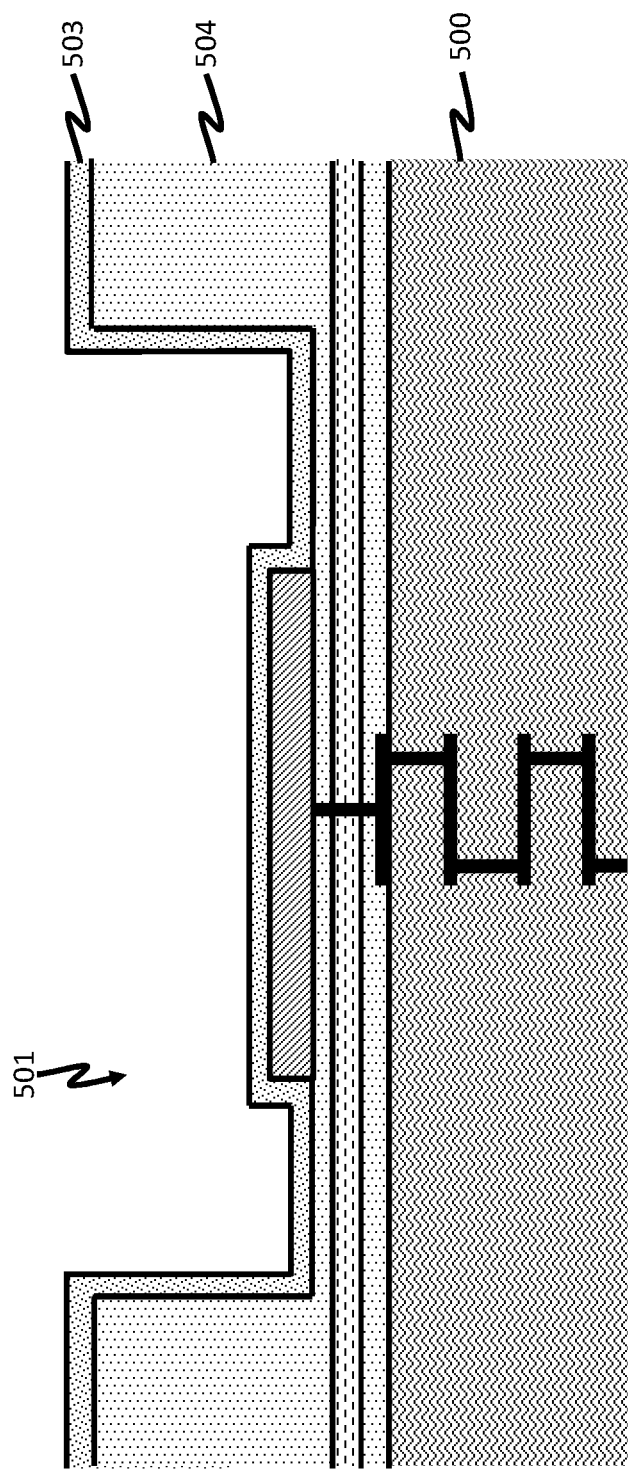

FIGS. 5H to 5M illustrate operation 404 of the pressure sensor manufacturing method in accordance with some embodiments of the present disclosure. As shown in FIG. 5H, a first film 503 is formed for covering the dielectric layer 504 and the semiconductor device 500 within the space 501. In some embodiments, the first film 503 includes silicon nitride.

Figure 5I:
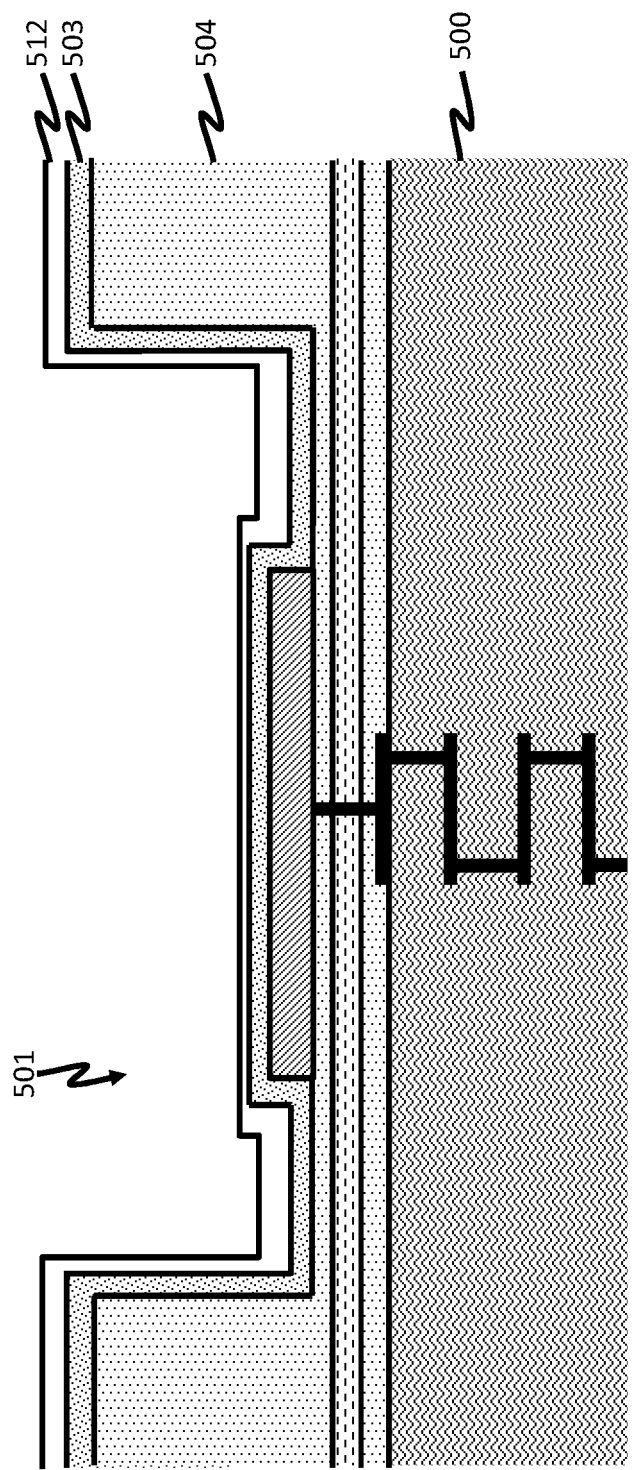
Figure 5J:
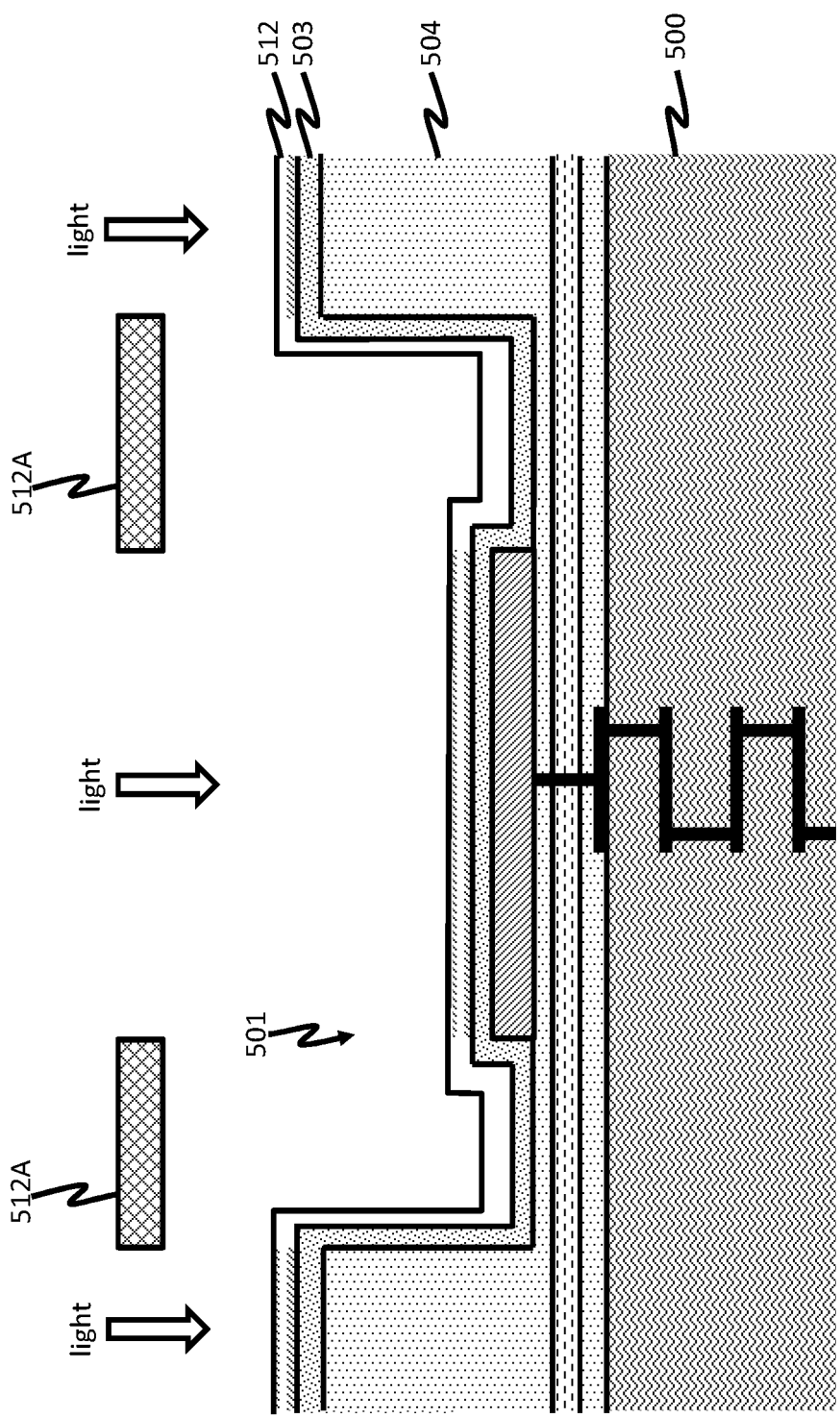
Figure 5K:
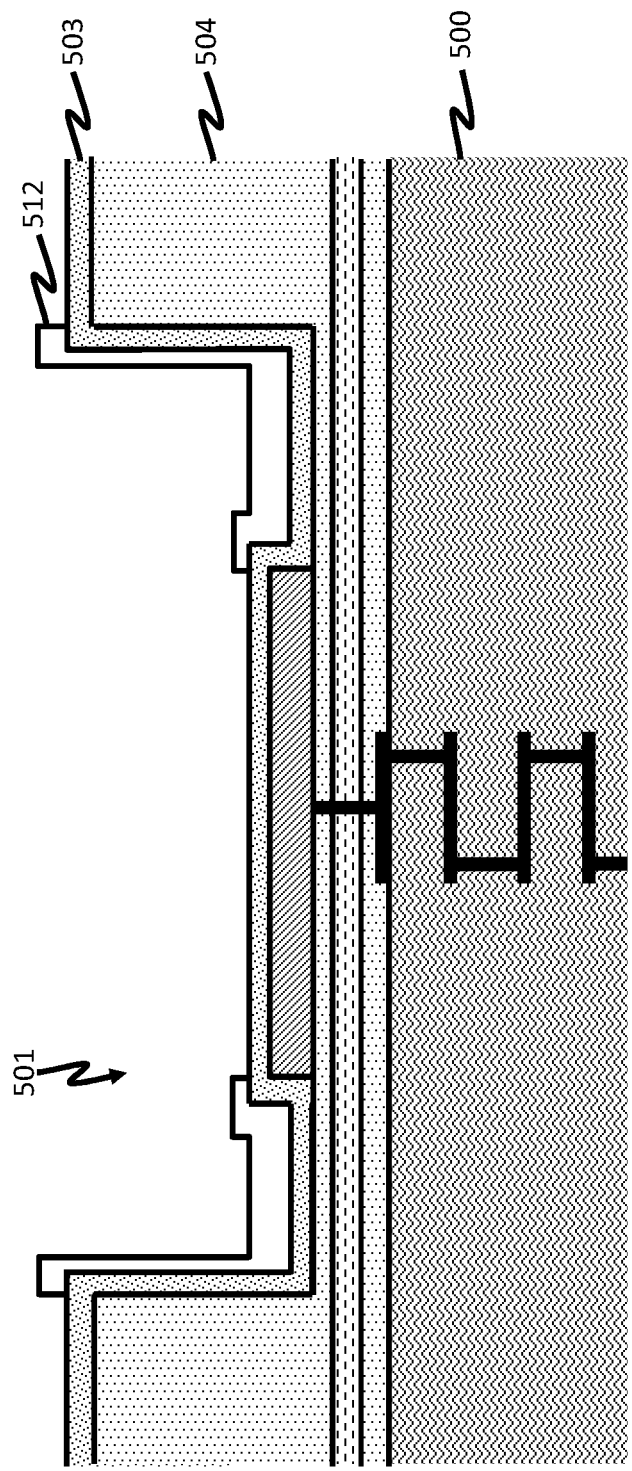

Referring to FIG. 5I, a radiation light sensitive coating layer 512 is formed over the first film 503. Another lithographical and etching process is performed to pattern the radiation light sensitive coating layer 512. As shown in FIGS. 5J and 5K, a patterned mask 512A is provided over the radiation light sensitive coating layer 512. In some embodiments, a portion of the radiation light sensitive coating layer 512, upon exposure to light passing through an opening in the patterned mask 512A, undergoes a cross linking process. As a result, the cross-linked portion is etched away.

Figure 5L:
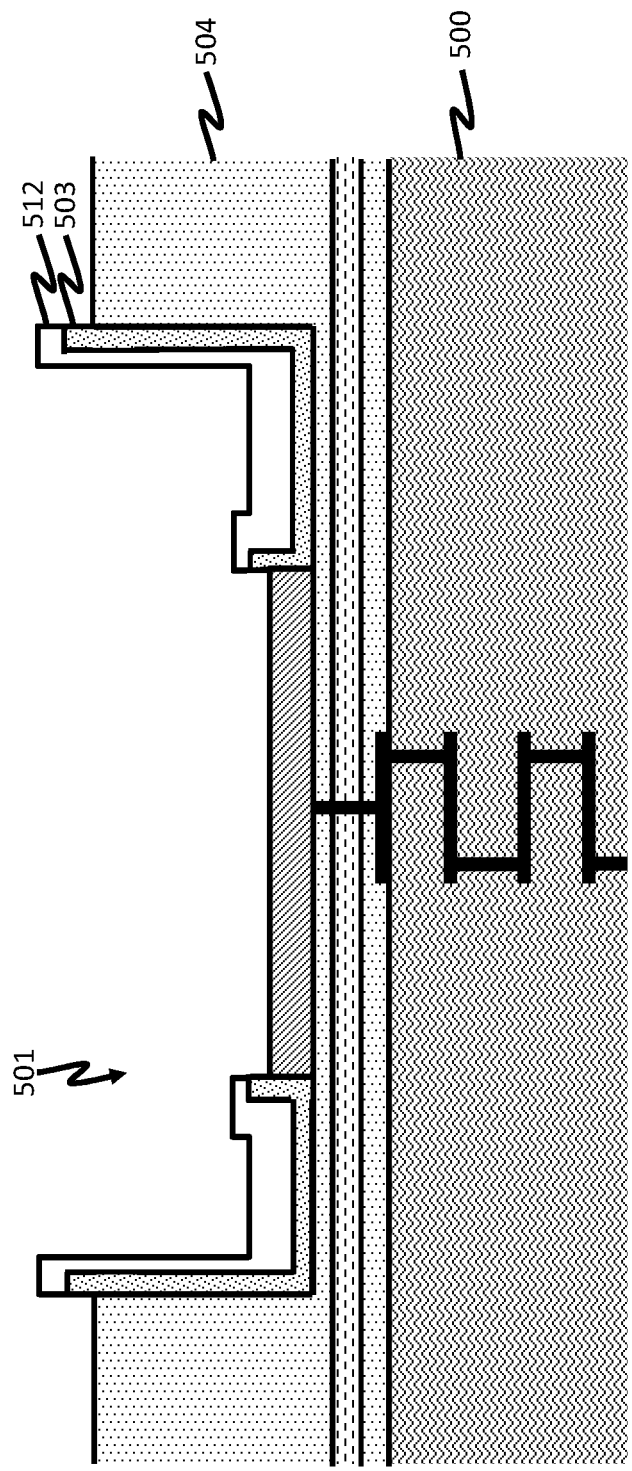
Figure 5M:
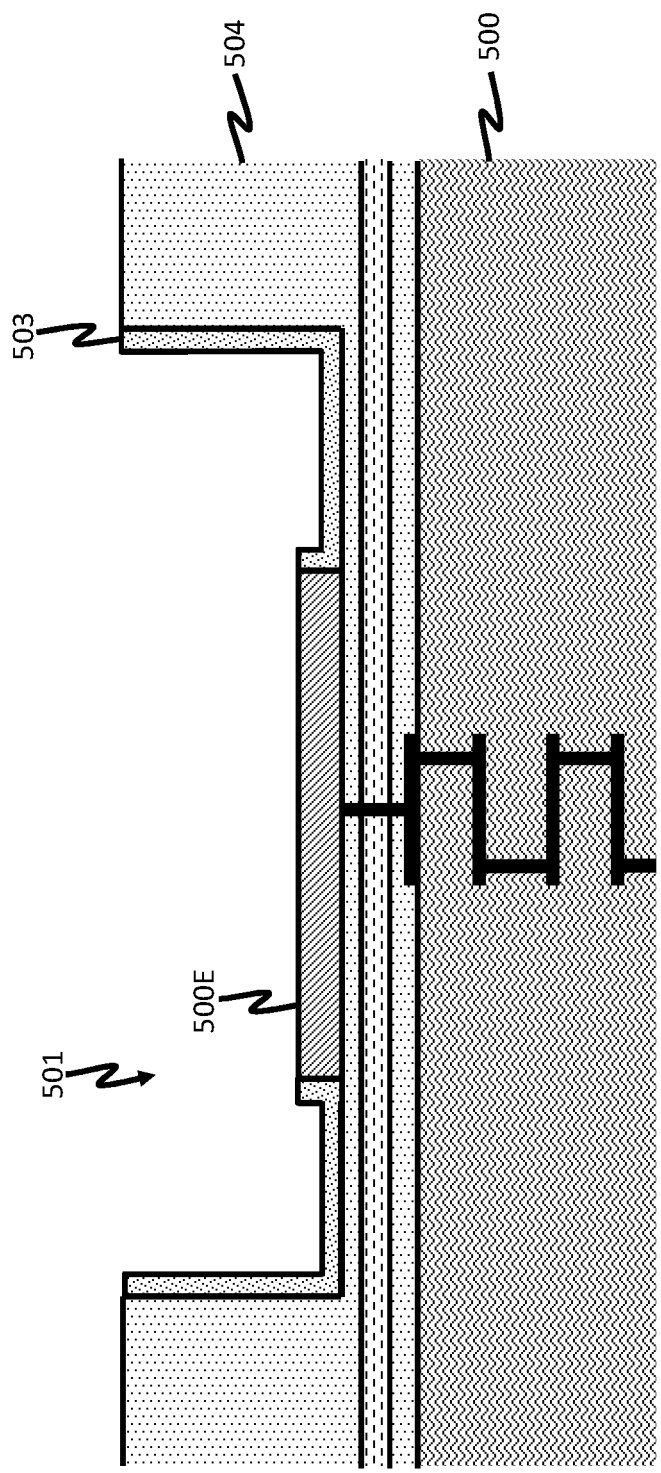

As shown in FIG. 5L, a portion of the first film 503 not protected by the radiation light sensitive coating layer 512 is removed. In FIG. 5M, the remaining portion of the radiation light sensitive coating layer 512 is removed. In some embodiments, after removing the radiation light sensitive coating layer 512, protrusions of the first film 503 higher than an exposed surface of the first electrode 500E can be planarized to be level with the exposed surface of the first electrode 500E. Protrusions of the first film 503 higher than an exposed surface of the dielectric layer 504 can be planarized to be level with the exposed surface of the dielectric layer 504.

In some embodiments, another radiation light sensitive coating layer having different characteristics and another patterned mask can be used to achieve the desired patterning result on the first film 503. In some embodiments, the radiation light sensitive coating layer 512 may include a positive tone resist or a negative tone resist, and the patterned mask 512A for patterning the first film 503 can be adjusted based on the positive tone resist or the negative tone resist of the radiation light sensitive coating layer 512.

Figure 5N:
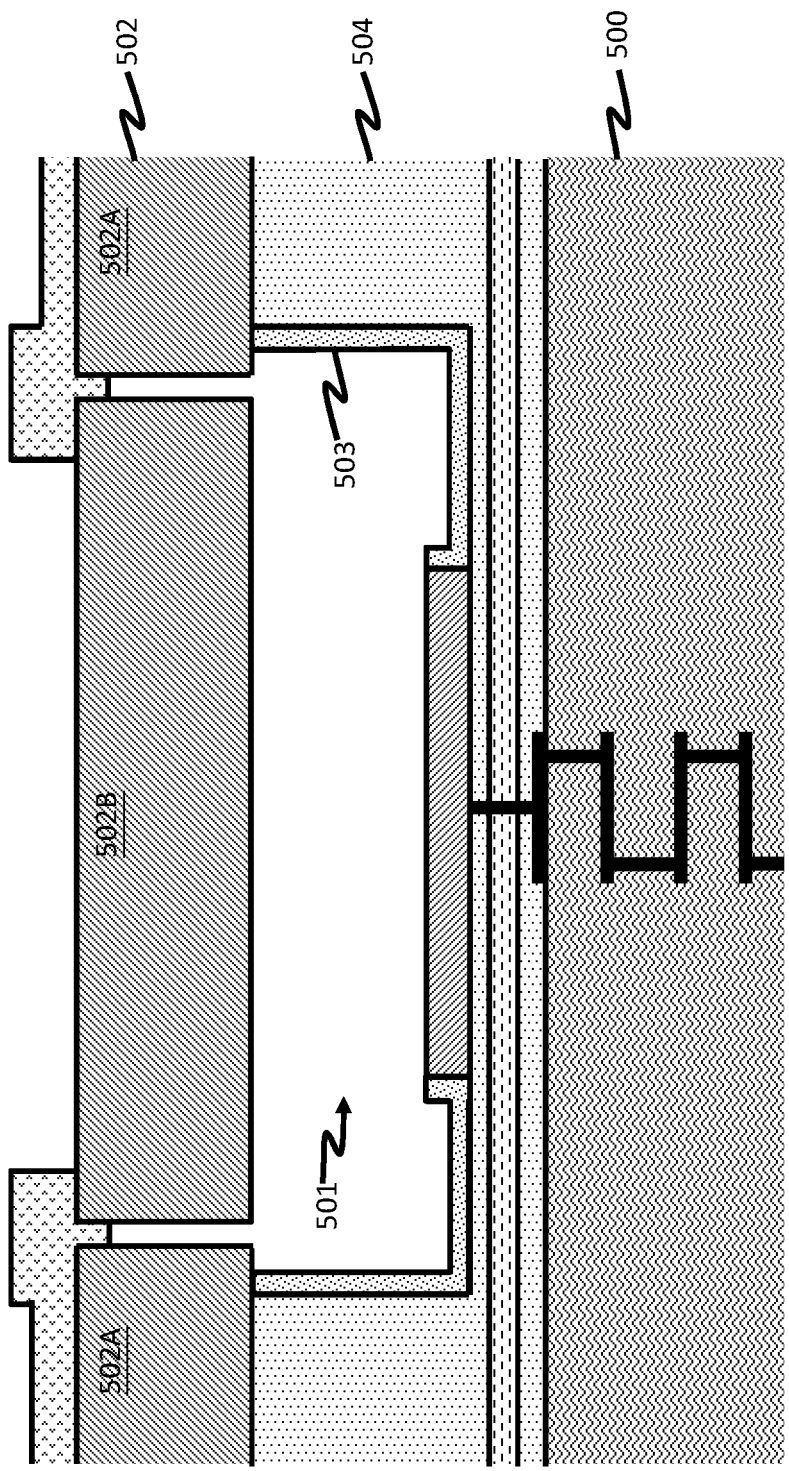
Figure 50:
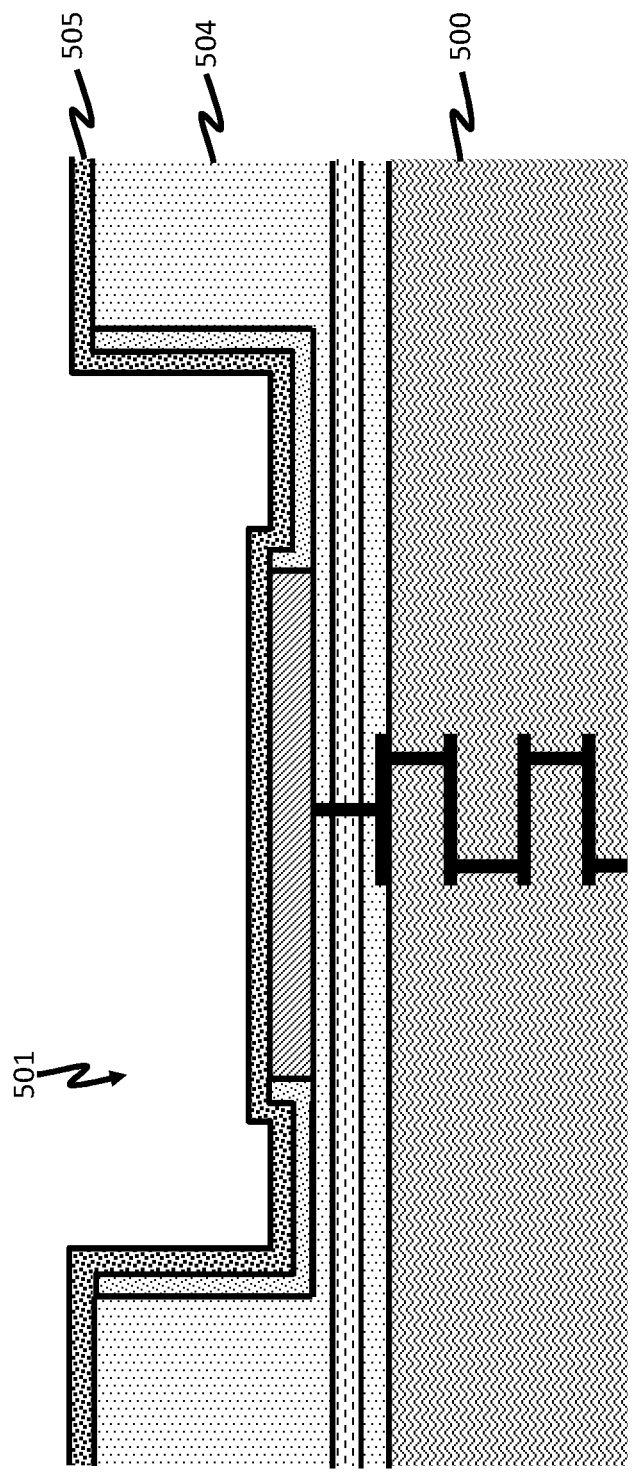

FIG. 5N illustrates operation 405 of the pressure sensor manufacturing method in accordance with some embodiments of the present disclosure. As shown in FIG. 5N, a pressure-sensing element 502 is bonded to the dielectric layer 504 for covering the space 501. In some embodiments, the pressure-sensing element 502 serves as a membrane and includes silicon. The pressure-sensing element 502 includes a first part 502A and a second part 502B. The first part 502A of the pressure-sensing element 502 is used for bonding to the dielectric layer 504. The second part 502B of the pressure-sensing element 502 is used as an electrode and for covering the space 501.

In some embodiments, after the pressure-sensing element 502 is bonded to the dielectric layer 504, the first film 503 contacts a portion of the first part 502A of the pressure-sensing element 502. The first film 503 does not fully cover the first part 502A.

FIGS. 5O to 5R illustrate the optional operation 406 of the pressure sensor manufacturing method in accordance with some embodiments of the present disclosure. As shown in FIG. 5O, before operation 405, a second film 505 is formed for covering the first film 503 within the space 501.

Figure 5P:
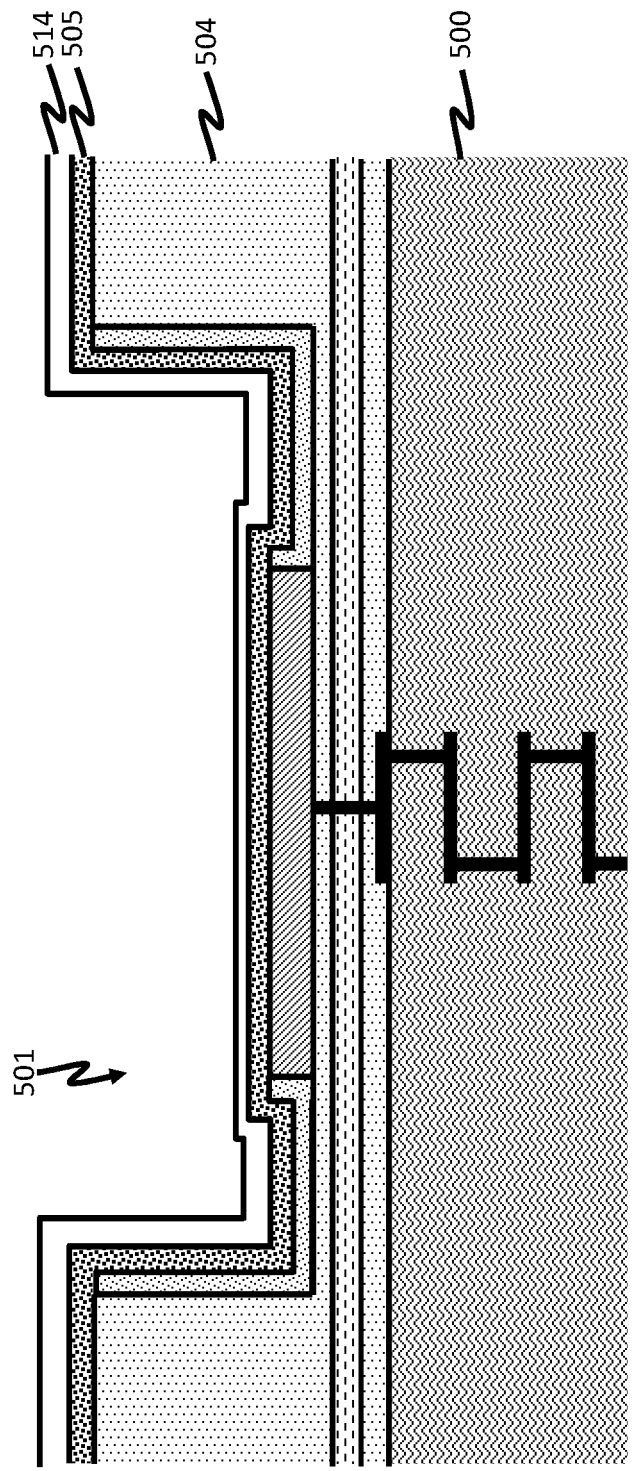
Figure 5Q:
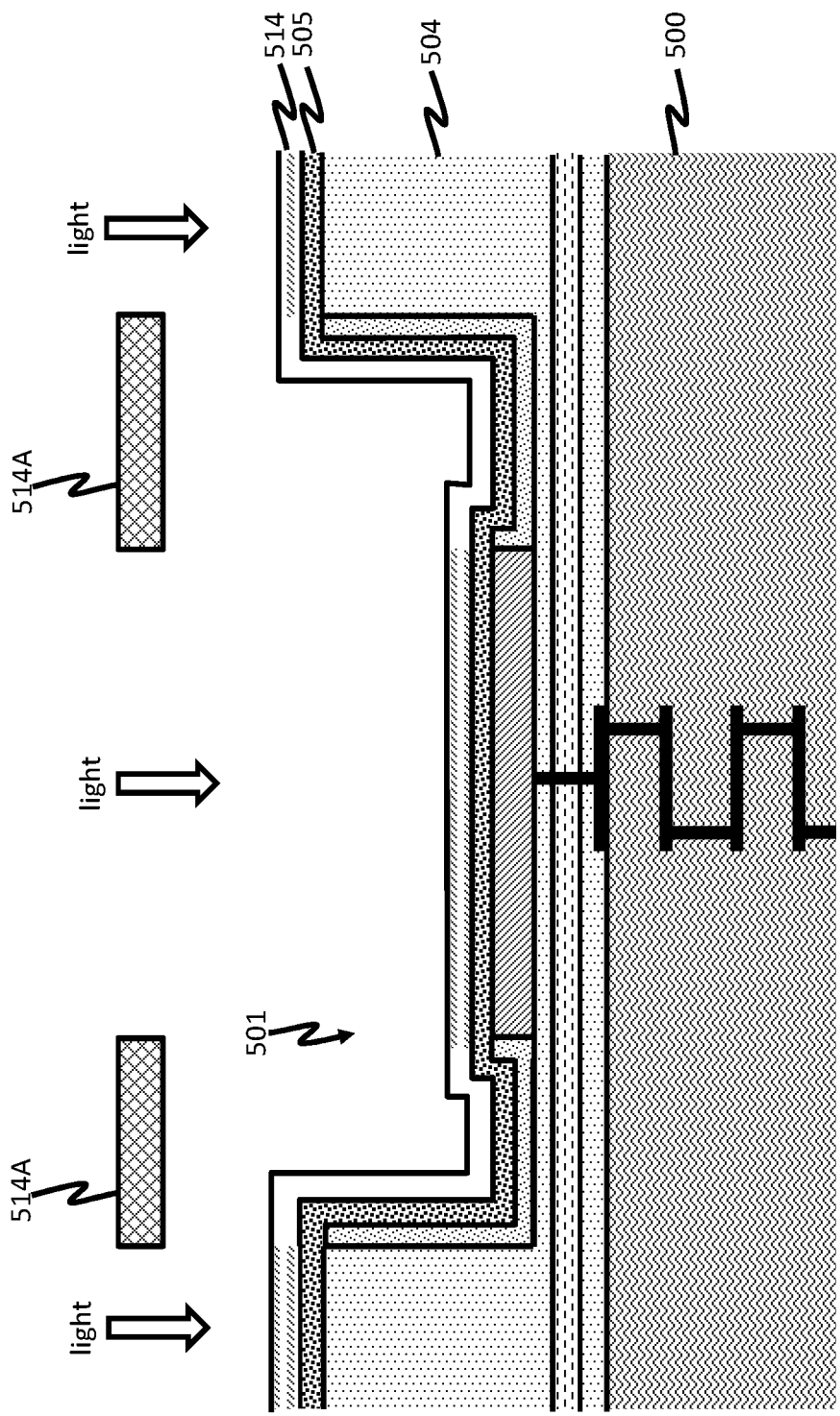
Figure 5R:
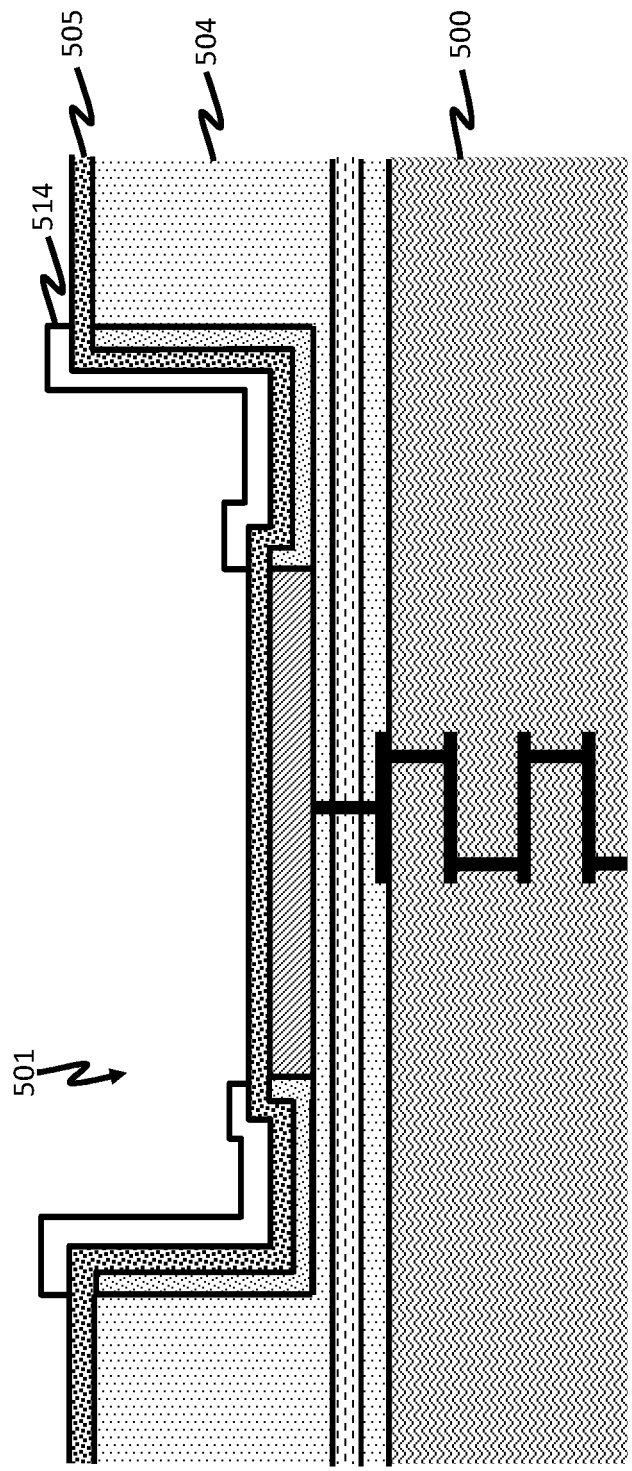

Referring to FIG. 5P, a radiation light sensitive coating layer 514 is formed over the second film 505. Another lithographical and etching process is performed to pattern the radiation light sensitive coating layer 514. In FIGS. 5Q and 5R, a patterned mask 514A is provided over the radiation light sensitive coating layer 514. In some embodiments, a portion of the radiation light sensitive coating layer 514, upon exposure to the light passing through an opening in the patterned mask 514A, undergoes a cross linking process. As a result, the cross-linked portion is etched away.

Figure 5S:
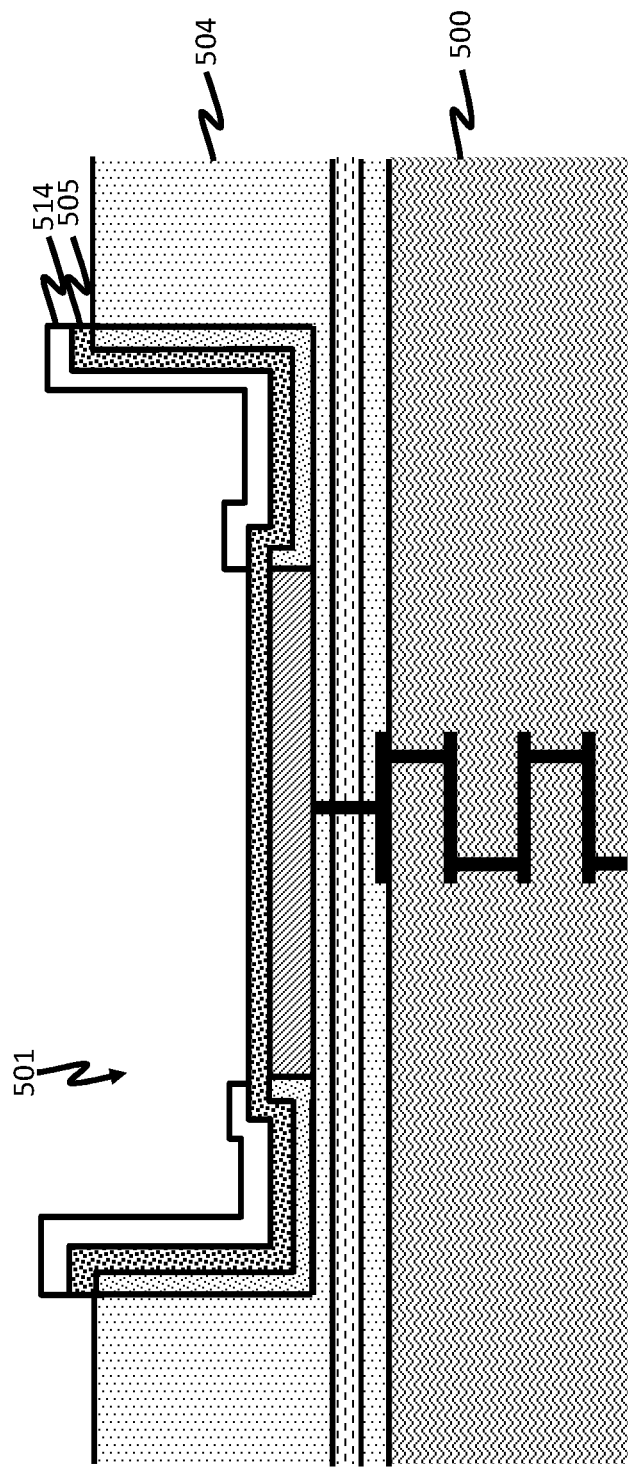
Figure 5T:
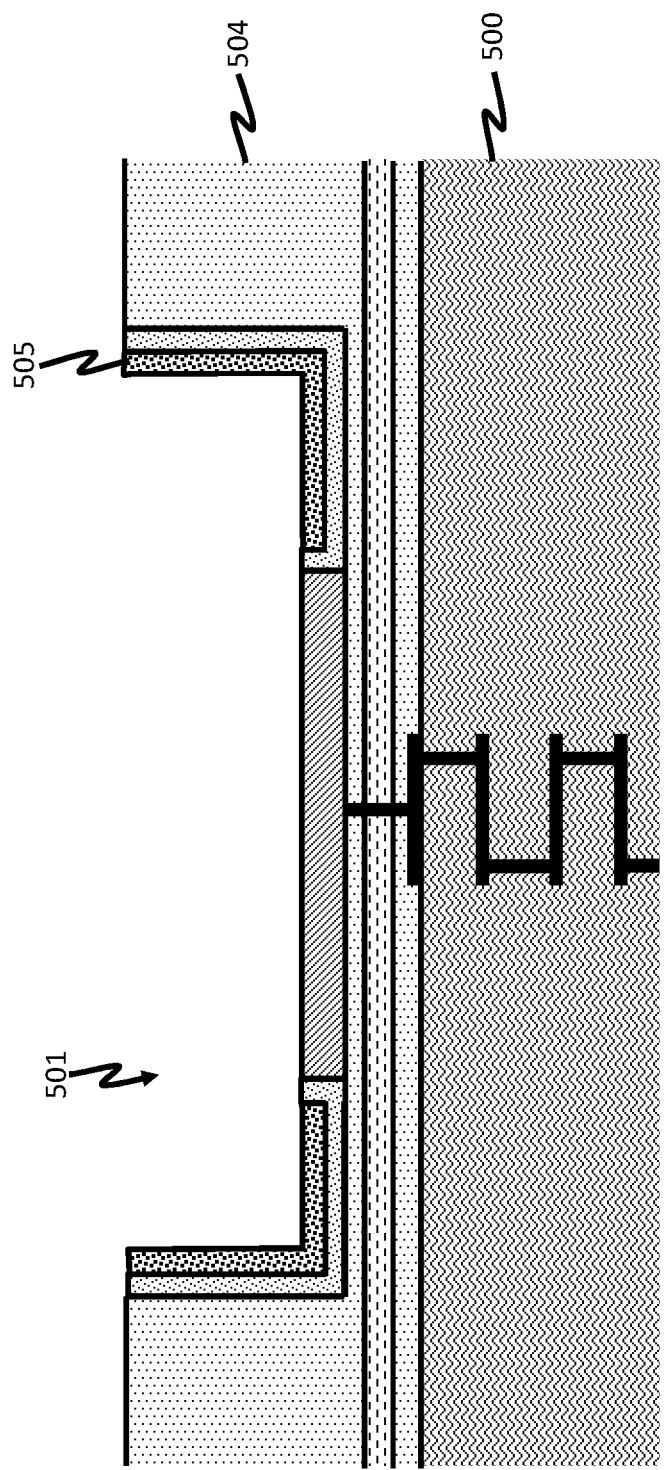
Figure 5U:
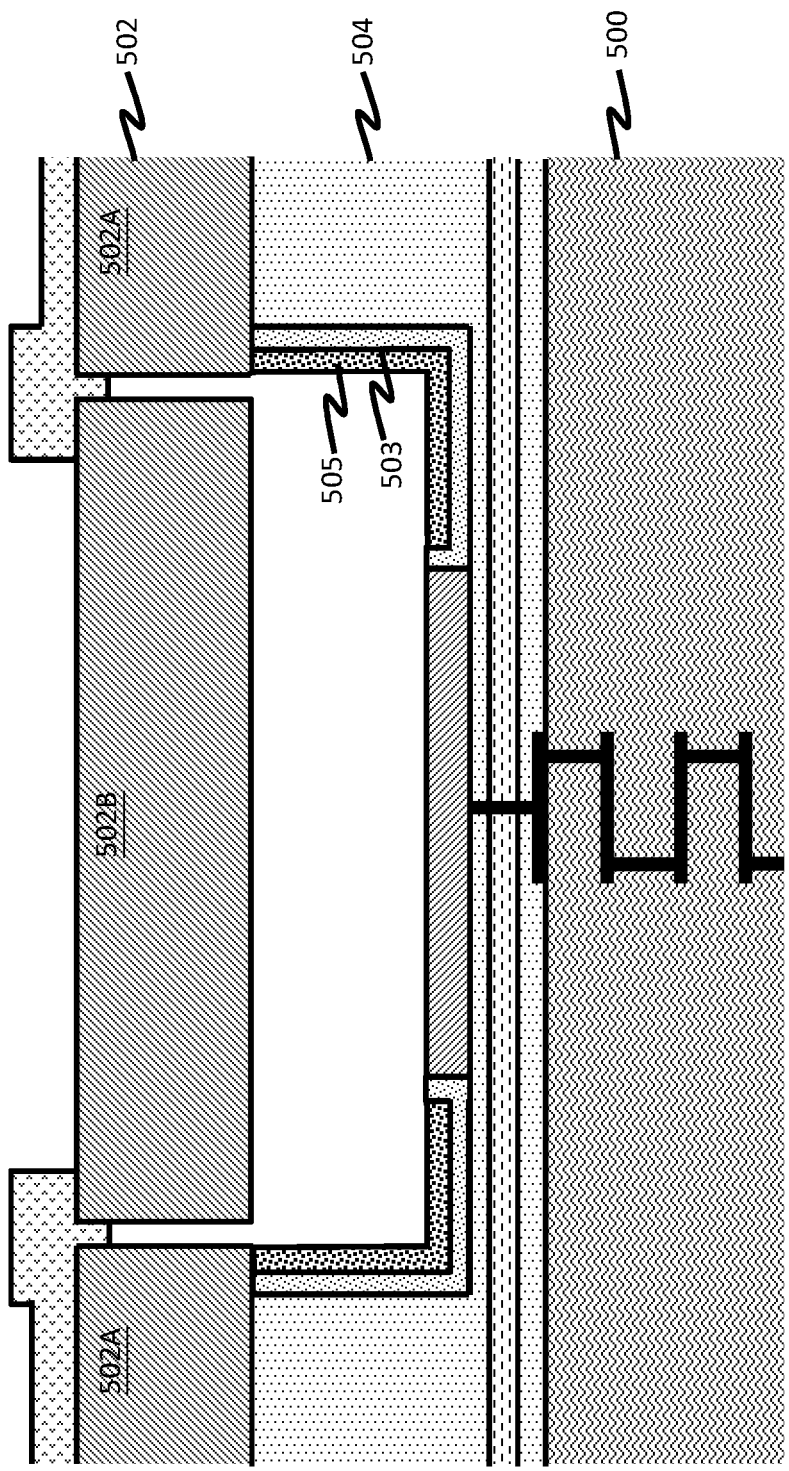

As shown in FIG. 5S, a portion of the film 505 not protected by the radiation light sensitive coating layer 514 is removed. In FIG. 5T, the remaining portion of the radiation light sensitive coating layer 514 is removed. In some embodiments, portions of the film 505 are planarized to be level with the electrode 500E and the dielectric layer 504 after removing the radiation light sensitive coating layer 514. As shown in FIG. 5U, the pressure-sensing element 502 is bonded to the dielectric layer 504 for covering the space 501.

In some embodiments, after the pressure-sensing element 502 is bonded to the dielectric layer 504, the first film 503 and the second film 505 respectively contact the first part 502A of the pressure-sensing element 502, but do not fully cover the first part 502A.

In some embodiments, another radiation light sensitive coating layer having different characteristics and another patterned mask can be used to achieve the desired patterning result on the second film 505. In some embodiments, the radiation light sensitive coating layer 514 may include a positive tone resist or a negative tone resist, and the patterned mask 514A for patterning the second film 505 can be adjusted based on the positive tone resist or the negative tone resist of the radiation light sensitive coating layer 514.

Some embodiments of the present disclosure provide a pressure sensor. The pressure sensor includes a chamber and a first film. The chamber includes a first wall with a first electrode and a second wall with a second electrode. The first wall faces the second wall, and the first electrode and the second electrode respectively include conductive or semiconductive material. The first film lines a surface inside the chamber exclusive of the first electrode and the second electrode, and is configured to block outgassing entering the chamber from the surface. In other words, the first film lines portions of the surface inside the chamber not including the first electrode and the second electrode, and is configured to block outgassing entering the chamber from the surface.

Some embodiments of the present disclosure provide a pressure sensor. The pressure sensor includes a semiconductor device, a cavity, a pressure-sensing element, and a first film. The semiconductor device has a first electrode. The cavity is formed over the semiconductor device, and the first electrode is exposed within the cavity. The pressure-sensing element is formed over the cavity and opposite to the semiconductor device. The first film covers an inner surface of the cavity exclusive of the first electrode and the pressure-sensing element, i.e., the first film covers portions of the inner surface of the cavity not including the first electrode and the pressure-sensing element.

Some embodiments of the present disclosure provide a method for manufacturing a pressure sensor. The method includes operations of: providing a semiconductor device with an electrode; forming a dielectric layer over the semiconductor device; forming a space in the dielectric layer, wherein the electrode is exposed within the space; forming a film for covering portions of the dielectric layer and the semiconductor device within the space exclusive of the electrode; and bonding a pressure-sensing element to the dielectric layer for covering the space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A pressure sensor, comprising:
a semiconductor device having a first electrode;
a cavity formed over the semiconductor device, wherein the first electrode is exposed within the cavity;
a pressure-sensing element formed over the cavity and opposite to the semiconductor device; and
a first film covering an inner surface of the cavity exclusive of a surface of the first electrode and the pressure-sensing element, wherein the surface of the first electrode faces toward the pressure-sensing element and the first electrode is partially covered by the first film.

2. The pressure sensor of claim 1, further comprising:
a dielectric layer disposed between the semiconductor device and the pressure-sensing element;
wherein the cavity is formed in the dielectric layer.

3. The pressure sensor of claim 1, further comprising:
a second film covering the first film.

4. The pressure sensor of claim 1, wherein the pressure-sensing element comprises:
a first part for bonding with the dielectric layer;
a second part serving as a second electrode for covering the cavity.

5. The pressure sensor of claim 4, wherein the second electrode is opposite to the first electrode in the cavity.

6. The pressure sensor of claim 4, wherein the first film covers the inner surface of the cavity exclusive of the surface of the first electrode and the second electrode of the pressure-sensing element.

7. The pressure sensor of claim 4, wherein the first electrode comprises conductive material and the second electrode comprises semiconductive material.

8. The pressure sensor of claim 1, wherein the first film comprises silicon nitride.

9. A pressure sensor, comprising:
a semiconductor device, forming a first wall of a chamber and having a first electrode exposed within the chamber;
a pressure-sensing element, forming a second wall of the chamber and being opposite to the semiconductor device; and
a first film covering sidewalls of the first electrode and an inner surface of the chamber exclusive of the pressure-sensing element.

10. The pressure sensor of claim 9, wherein the chamber further comprises:
a second film covering the first film.

11. The pressure sensor of claim 10, wherein the first film and the second film include different materials.

12. The pressure sensor of claim 9, wherein the pressure-sensing element comprises:
a part serving as a second electrode.

13. The pressure sensor of claim 12, wherein the second electrode is opposite to the first electrode in the chamber.

14. The pressure sensor of claim 13, further comprising:
a detector electrically connected to the first electrode and the second electrode, wherein the detector is configured to:
detect a capacitance change between the first electrode and the second electrode, wherein the capacitance change is caused by a change of distance between the first electrode and the second electrode, and the change of distance is caused by a pressure difference between a reference pressure in the chamber and an applied atmospheric pressure.

15. The pressure sensor of claim 14, wherein the detector is further configured to:
determine a pressure change based on the capacitance change.

16. The pressure sensor of claim 14, wherein the reference pressure is a vacuum pressure.

17. The pressure sensor of claim 9, further comprising:
a dielectric layer disposed between the semiconductor device and the pressure-sensing element, wherein the chamber is in the dielectric layer.

18. A pressure sensor, comprising:
a semiconductor device having a first electrode;
a pressure-sensing element;
a dielectric layer disposed between the semiconductor device and the pressure-sensing element, wherein a cavity is formed in the dielectric layer and the first electrode is exposed within the cavity;
a first film covering an inner surface of the cavity exclusive of the first electrode and the pressure-sensing element, wherein the inner surface includes a surface of the semiconductor device and two surfaces of the dielectric layer within the cavity.

19. The pressure sensor of claim 18, further comprising:
a second film fully covering the first film.

20. The pressure sensor of claim 18, wherein the first film includes a protrusion higher that a surface of the first electrode.

* * * * *